(12) United States Patent
Urakawa

(10) Patent No.: US 7,760,537 B2
(45) Date of Patent: Jul. 20, 2010

(54) PROGRAMMABLE ROM

(75) Inventor: Yukihiro Urakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 12/129,274

(22) Filed: May 29, 2008

(65) Prior Publication Data

US 2008/0297195 A1 Dec. 4, 2008

(30) Foreign Application Priority Data

May 31, 2007 (JP) .............................. 2007-145271
May 16, 2008 (JP) .............................. 2008-129817

(51) Int. Cl.
*G11C 7/00* (2006.01)
(52) U.S. Cl. ...................... 365/104; 365/205
(58) Field of Classification Search .................. 365/104, 365/205
See application file for complete search history.

(56) References Cited

U.S. PATENT DOCUMENTS

| 5,027,186 | A | 6/1991 | Kinugawa |
| 5,455,788 | A | 10/1995 | Clark |
| 5,757,696 | A * | 5/1998 | Matsuo et al. ......... 365/185.07 |
| 7,092,273 | B2 | 8/2006 | Look |
| 7,369,438 | B2 * | 5/2008 | Lee ....................... 365/185.17 |

FOREIGN PATENT DOCUMENTS

| JP | 6-112437 | 4/1994 |
| JP | 7-130180 | 5/1995 |

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A programmable ROM includes first and second field effect transistors serially connected between first and second power source terminals, a third field effect transistor having a gate connected to a word line and used for data transfer between a first bit line and the drains of the first and second field effect transistors, fourth and fifth field effect transistors serially connected between the first and second power source terminals, and a sixth field effect transistor having a gate connected to the word line and used for data transfer between a second bit line and the drains of the fourth and fifth field effect transistors. The threshold voltages of the first and fourth field effect transistors are different from each other and the magnitude relation thereof is determined according to ROM data.

20 Claims, 20 Drawing Sheets

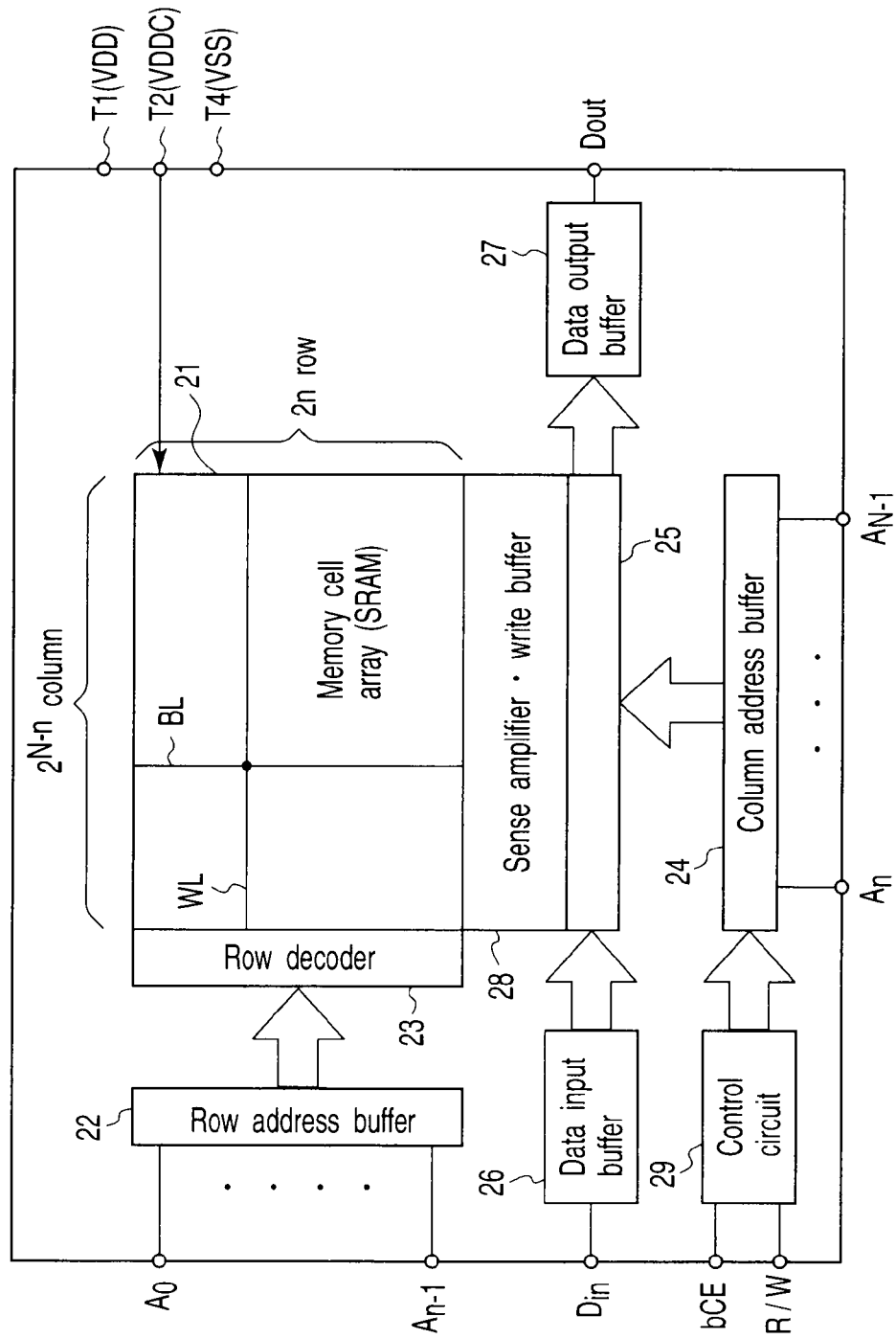
F I G. 12

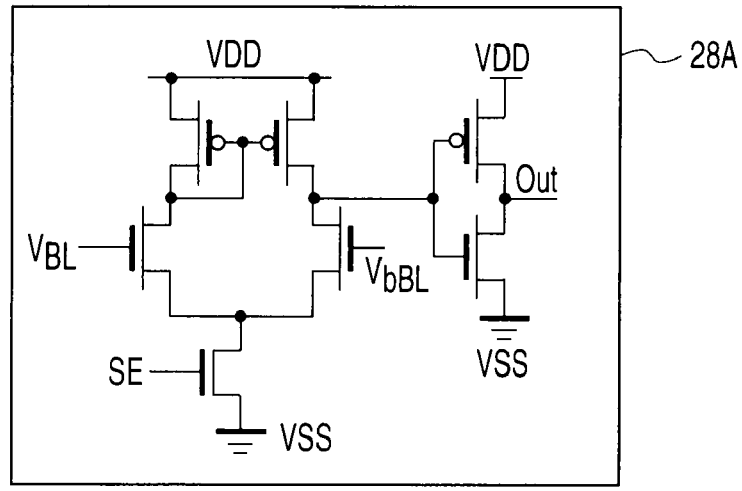
F I G. 1 4
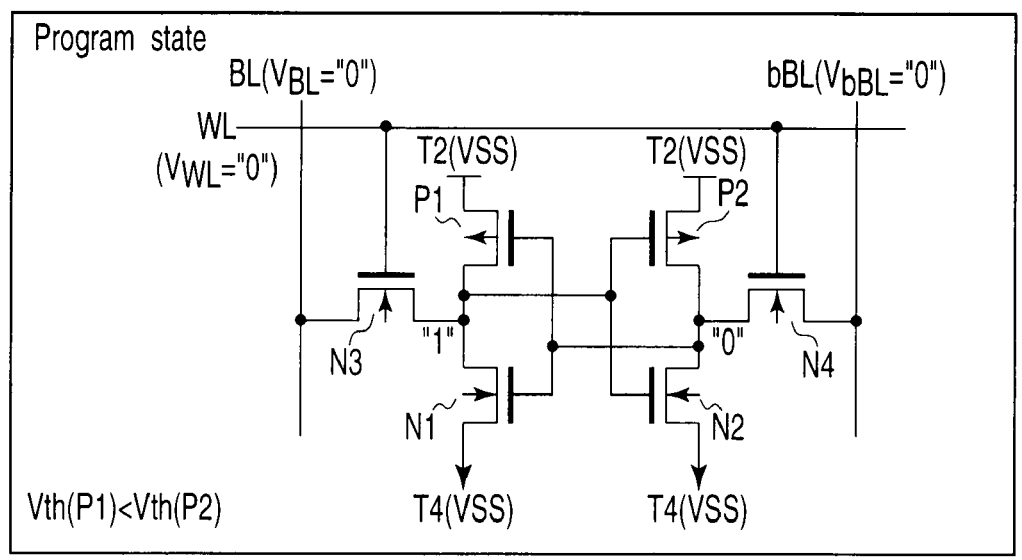
F I G. 1 5

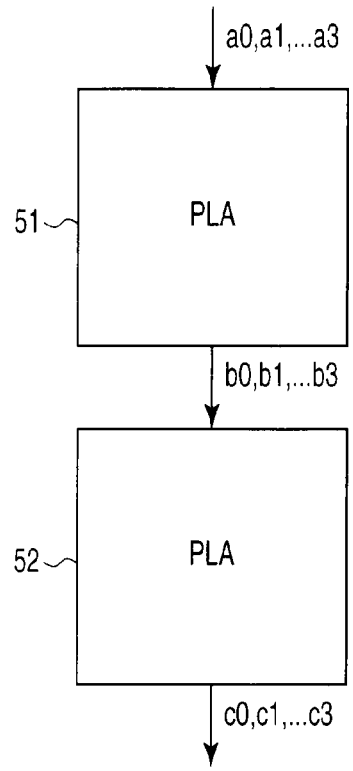
F I G. 22
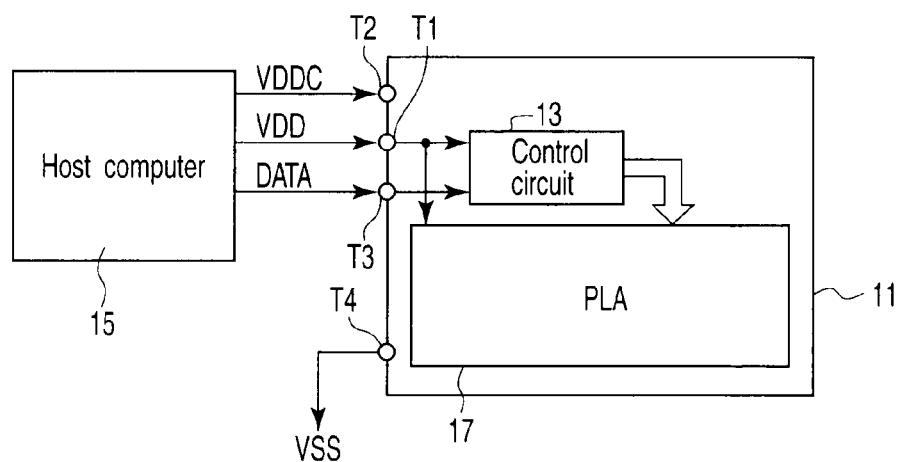
F I G. 24

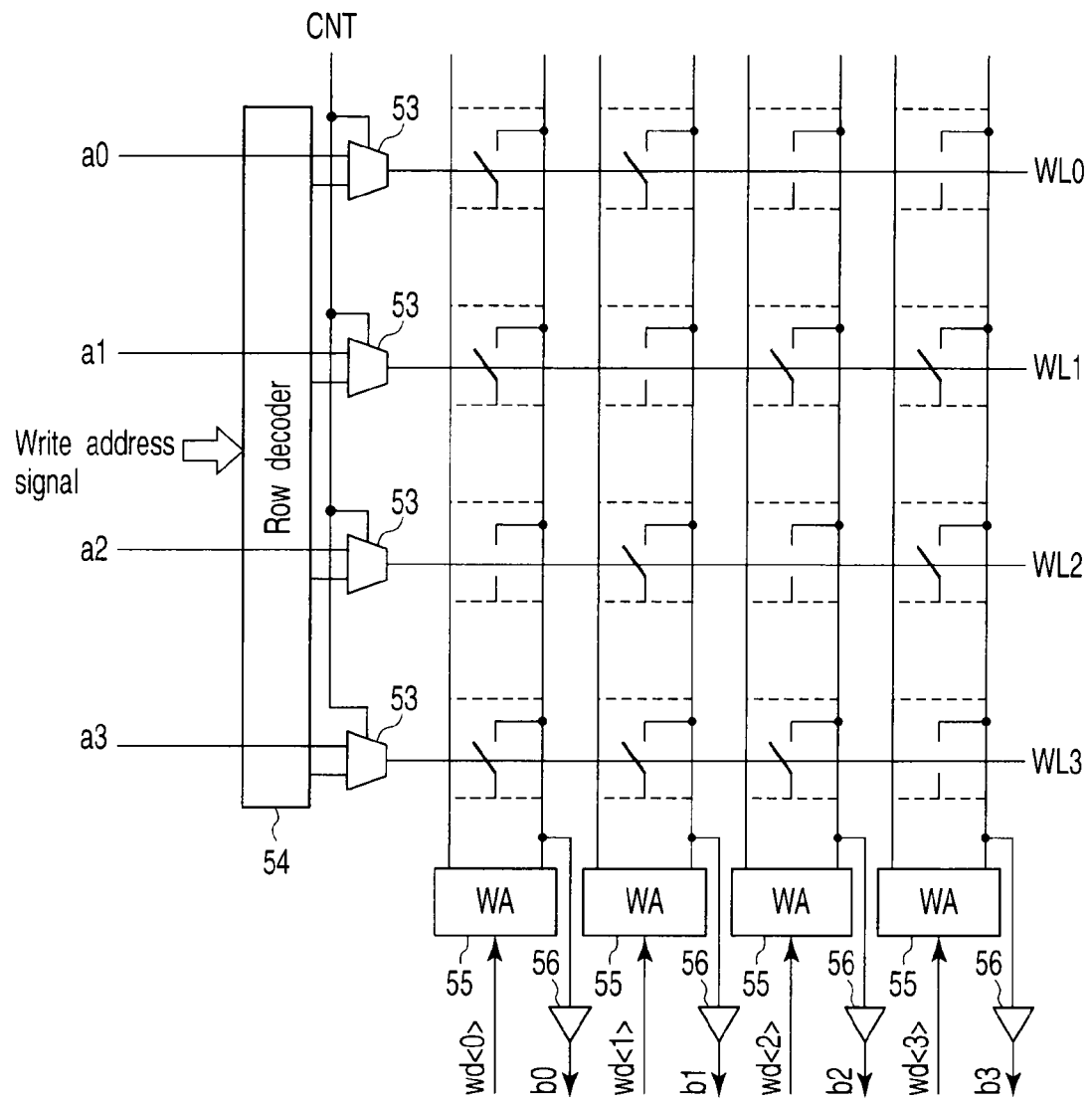
F I G. 27

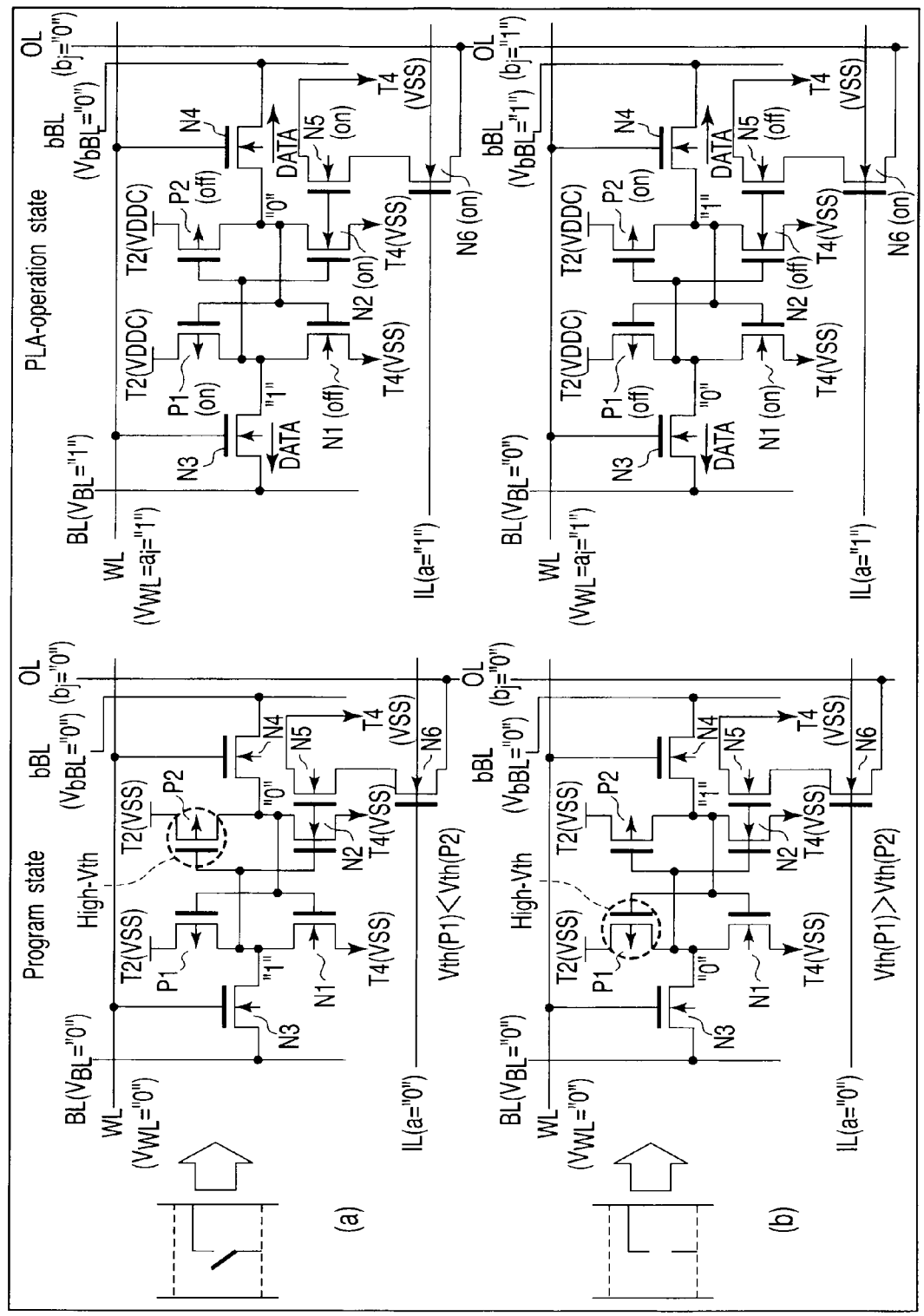
F I G. 28

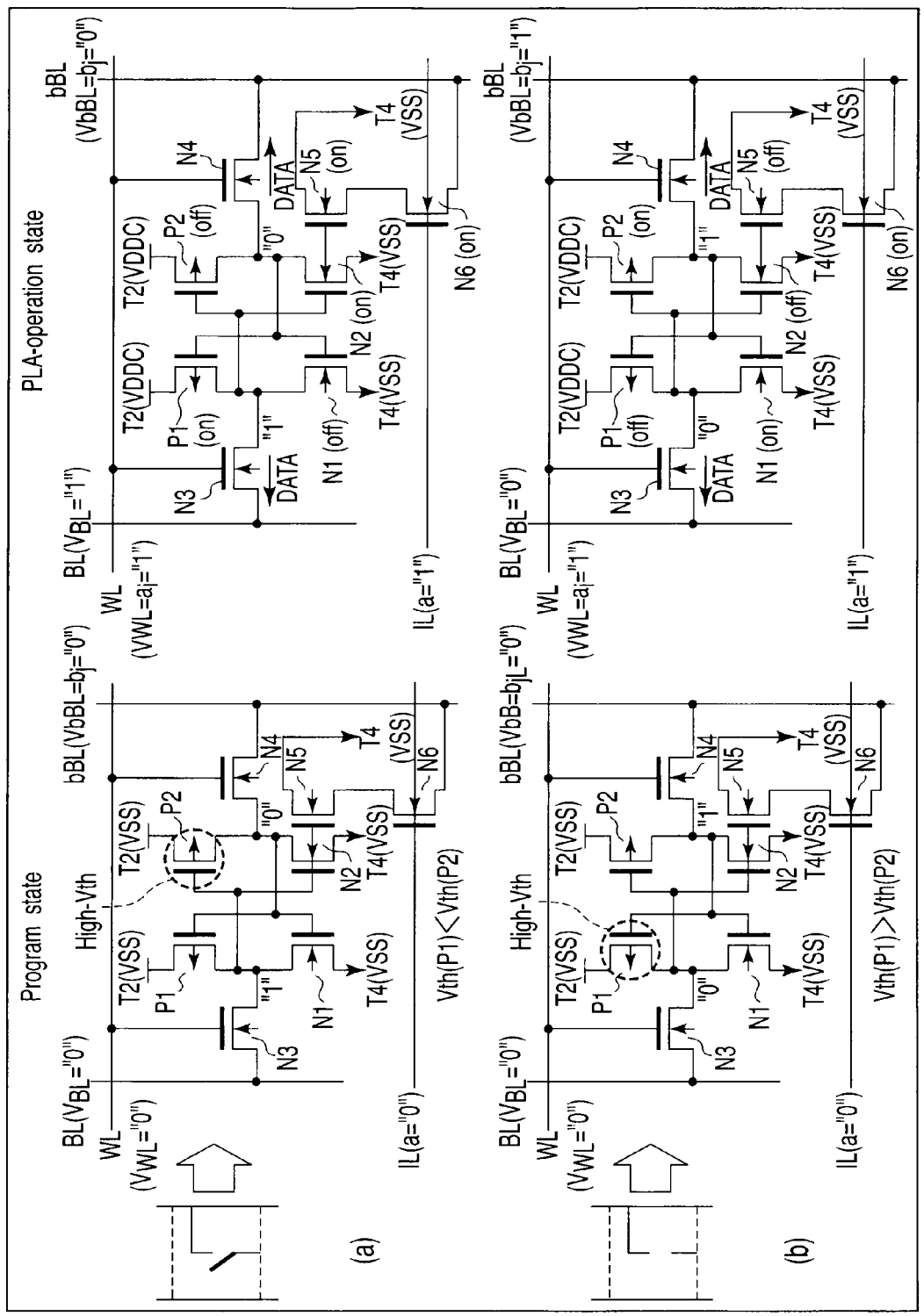
F I G. 30

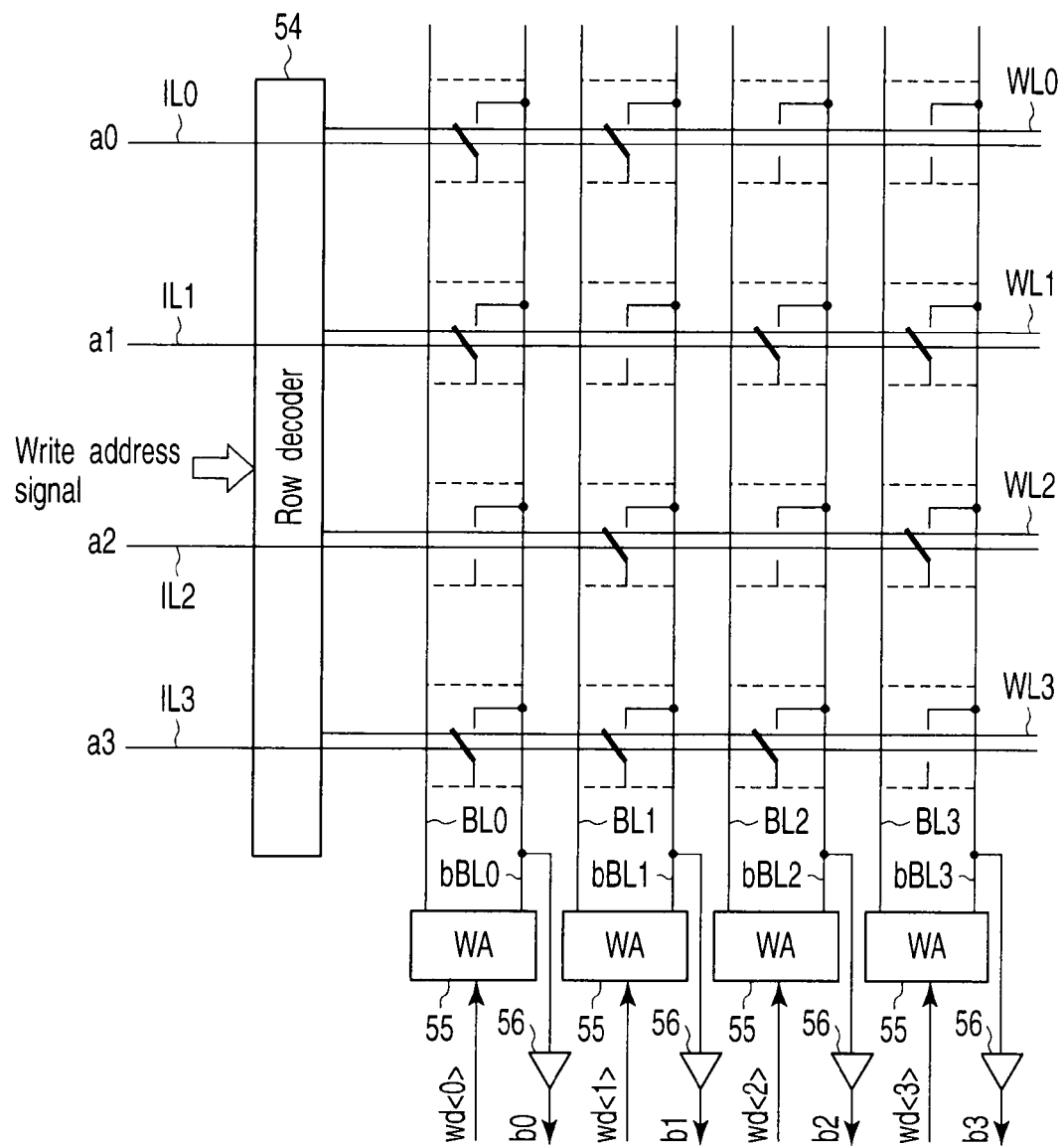
F I G. 31

PROGRAMMABLE ROM

CROSS-REFERENCE TO RELATED APPLICATIONS

This application is based upon and claims the benefit of priority from prior Japanese Patent Applications No. 2007-145271, filed May 31, 2007; and No. 2008-129817, filed May 16, 2008, the entire contents of both of which are incorporated herein by reference.

BACKGROUND OF THE INVENTION

1. Field of the Invention

This invention relates to a programmable ROM (Read Only Memory).

2. Description of the Related Art

Conventionally, as a programmable ROM, a poly-fuse (a fuse which is comprised of a poly-silicon) and PCOP (Pure CMOS one-time programmable) memory are known.

For example, the poly-fuse stores data by causing a large current to pass through the poly-fuse, converting the same into an amorphous form and changing the resistance thereof. Further, for example, the PCOP memory stores data by applying high voltage to the gate insulating film of a P-channel MOS transistor and destroying the same. In either situation, since data can be programmed only once, the above memories are called an OTP (One time programmable ROM).

However, in the above programmable ROM, since a large current or high voltage is required for data programming, the configuration of a control circuit that controls the data programming becomes complicated.

Generally, the technique for using an SRAM (Static RAM) as a ROM is known (for example, refer to Jpn. Pat. Appln. KOKAI Publication No. H6-112437 and Jpn. Pat. Appln. KOKAI Publication No. H7-130180).

The principle is that the resistances of the load resistors of the SRAM, that is, the load resistors of back-to-back inverters are made different to set the initial state at the power-ON time to a fixed value.

However, the resistances of the load resistors are determined by a dose amount in ion implantation in a wafer process. In this situation, the number of mask processes is increased and this enhances the manufacturing cost.

BRIEF SUMMARY OF THE INVENTION

According to an aspect of the present invention, there is provided a programmable ROM including a first field effect transistor of a first conductivity type having a source connected to a first power source terminal and acting as a load, a second field effect transistor of a second conductivity type having a source connected to a second power source terminal and a drain connected to a drain of the first field effect transistor, a third field effect transistor of the second conductivity type having a gate connected to a word line and used for data transfer between a first bit line and the drains of the first and second field effect transistors, a fourth field effect transistor of the first conductivity type having a source connected to the first power source terminal and acting as a load, a fifth field effect transistor of the second conductivity type having a source connected to the second power source terminal and a drain connected to a drain of the fourth field effect transistor, and a sixth field effect transistor of the second conductivity type having a gate connected to the word line and used for data transfer between a second bit line and the drains of the fourth and fifth field effect transistors. The gates of the first and second field effect transistors are connected to the drains of the fourth and fifth field effect transistors and the gates of the fourth and fifth field effect transistors are connected to the drains of the first and second field effect transistors. The threshold voltages of the first and fourth field effect transistors are different from each other and the magnitude relation thereof is determined according to ROM data.

BRIEF DESCRIPTION OF THE SEVERAL VIEWS OF THE DRAWING

FIG. 12 is a diagram showing the block configuration of a ROM chip.

FIG. 14 is a diagram showing an example of the circuit of a sense amplifier.

FIG. 15 is a diagram for illustrating NBTI at the read time.

FIG. 22 is a diagram showing a PLA.

FIG. 24 is a diagram showing a PLA system.

FIG. 27 is a diagram showing a first example of a PLA system.

FIG. 28 is a diagram showing a second example of the ROM cells in the PLA.

FIG. 30 is a diagram showing a third example of the ROM cells in the PLA.

FIG. 31 is a diagram showing a third example of the PLA system.

DETAILED DESCRIPTION OF THE INVENTION

A programmable ROM of an aspect of the present invention will be described below in detail with reference to the accompanying drawings.

1. Outline

This invention relates to the technique for using an SRAM as a programmable ROM and the feature thereof lies in that the threshold voltages of paired field effect transistors acting as loads of back-to-back inverters in the SRAM cell are positively made different from each other.

This invention utilizes a variation in the threshold voltage of the field effect transistor due to NBTI (Negative Bias Threshold Instability) that is an index associated with degradation in the reliability of the SRAM cell in order to make different the threshold voltages of the paired field effect transistors.

In this situation, since it is only required to change the operation of a control circuit that controls a program operation for ROM data in a programmable ROM and it is unnecessary to change hardware such as the control circuit and SRAM cell, the circuit can be prevented from being complicated.

Further, since the wafer process is not changed, the manufacturing cost can be lowered in comparison with a technique for making different the resistances of the load resistors of the back-to-back inverters.

2. Embodiment (1) System

Figure 1:
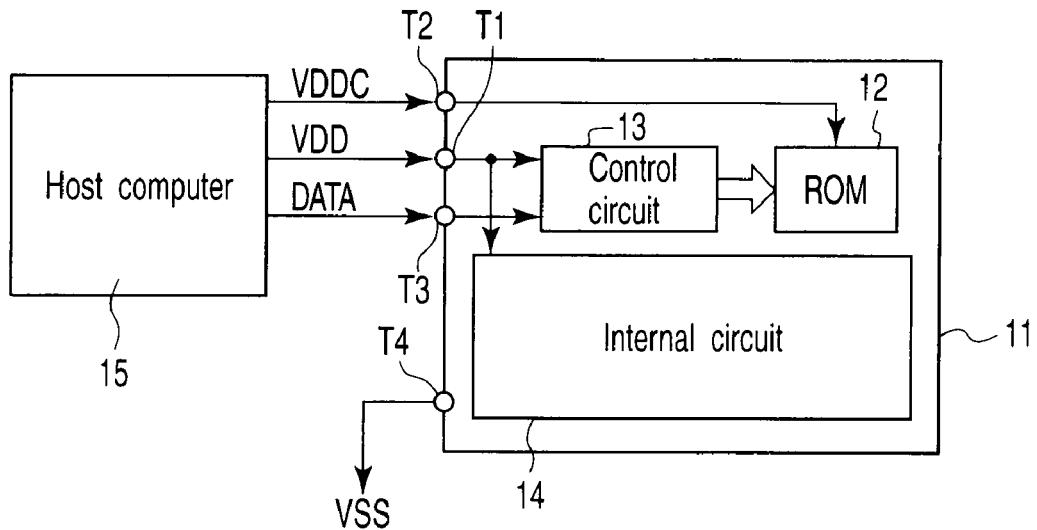
FIG. 1 is a diagram showing a system at the programming time.

FIG. 1 shows a system for ROM data programming.

A semiconductor integrated circuit (semiconductor chip) 11 is a microcomputer, system LSI, memory, logic LSI or the like. In the semiconductor integrated circuit 11, a programmable ROM 12, control circuit 13 and internal circuit 14 are arranged.

The programmable ROM 12 includes SRAM cells and stores program data used to control the operation of the internal circuit 14 and trimming data used to adjust the characteristic of the internal circuit 14. The control circuit 13 controls the program operation for the programmable ROM 12. The internal circuit 14 includes elements corresponding to the type of the semiconductor integrated circuit 11.

A host computer 15 supplies program data DATA and power source voltages VDD, VDDC required for programming ROM data into the programmable ROM 12 to the semiconductor integrated circuit 11.

The power source voltage VDD is voltage to drive the control circuit 13 and internal circuit 14 and is supplied to a power source terminal T1. The power source voltage VDDC is voltage different from the power source voltage VDD, for example, voltage higher than the power source voltage VDD and is directly supplied to the programmable ROM 12 via a power source terminal T2.

The power source terminal T2 is not connected to the internal circuit 14.

The program data DATA is supplied to a data input terminal T3.

Power source voltage VSS is voltage lower than the power source voltages VDD, VDDC, for example, ground voltage and is supplied to a power source terminal T4.

A difference between the power source voltages VDDC and VSS is larger than a difference between the power source voltages VDD and VSS.

(2) Programmable ROM

Figure 2:
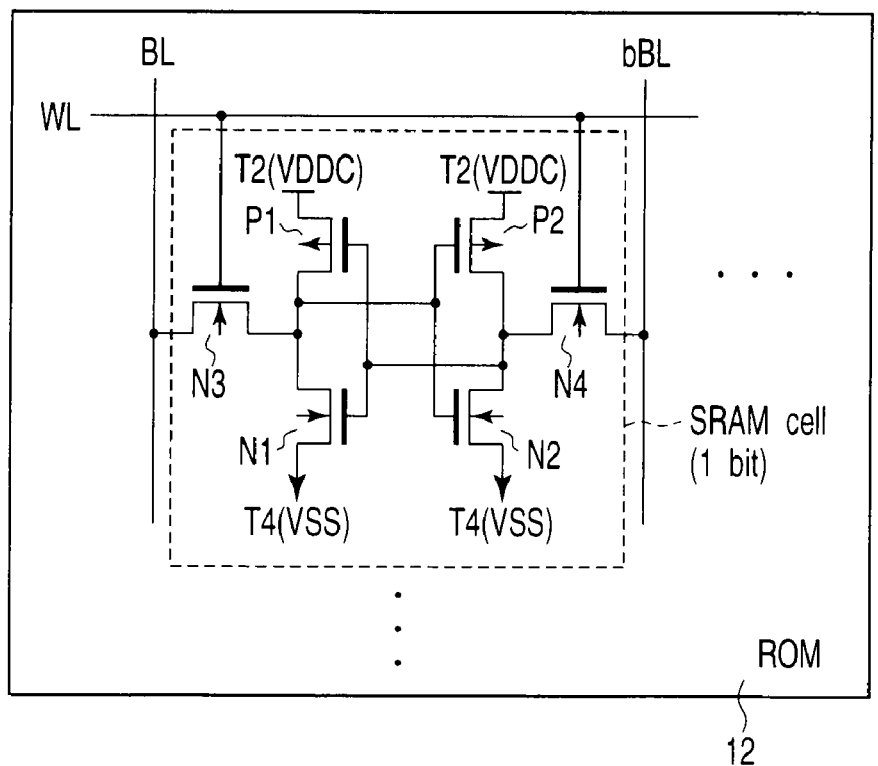
FIG. 2 is a diagram showing a programmable ROM.

FIG. 2 is a diagram showing a programmable ROM.

The programmable ROM 12 includes SRAM cells.

P-channel MOSFETs P1, P2 act as loads of back-to-back inverters configuring the SRAM cell. The sources of the P-channel MOSFETs P1, P2 are connected to the power source terminal T2 (VDDC).

The source of an N-channel MOSFET N1 is connected to the power source terminal T4 (VSS) and the drain thereof is connected to the drain of the P-channel MOSFET P1. Further, the source of an N-channel MOSFET N2 is connected to the power source terminal T4 (VSS) and the drain thereof is connected to the drain of the P-channel MOSFET P2.

The gates of the P-channel MOSFET P1 and N-channel MOSFET N1 are commonly connected to the drains of the P-channel MOSFET P2 and N-channel MOSFET N2.

An N-channel MOSFET N3 is connected between a bit line BL and the drains of the P-channel MOSFET P1 and N-channel MOSFET N1 and is used for data transfer therebetween. The gate of the N-channel MOSFET N3 is connected to a word line WL.

An N-channel MOSFET N4 is connected between a bit line bBL and the drains of the P-channel MOSFET P2 and N-channel MOSFET N2 and is used for data transfer therebetween. The gate of the N-channel MOSFET N4 is connected to the word line WL.

The configuration of the SRAM cell is the same as the configuration of an SRAM cell used as a general memory, but is different from the configuration of the SRAM cell used as a general memory in that the power source voltage VDDC applied to the SRAM cell is different from the power source voltages VDD which drives the internal circuit.

In this invention, as described in "Outline", ROM data is programmed by making different the threshold voltages of the P-channel MOSFETs P1, P2 used as the loads of the back-to-back inverters.

That is, in each of the SRAM cells as the programmable ROM of this invention, the magnitude relation between the threshold voltages of the P-channel MOSFETs P1, P2 is determined according to ROM data. In this situation, the threshold voltages of the P-channel MOSFETs P1, P2 are kept different in the state set up after programming.

(3) Programming

The programming operation for the programmable ROM is explained with reference to the flowchart of FIG. 3.

The programming operation is controlled by the control circuit 13 of FIG. 1.

First, an address of the programmable ROM (SRAM array) is set to an initial address (ADD=0) (step ST1).

Then, the operation of writing data which is reverse with respect to program data into an SRAM cell specified by the initial address is performed (step ST2).

The write operation is performed in the same manner as the write operation for an SRAM cell as a general memory.

Figure 4:
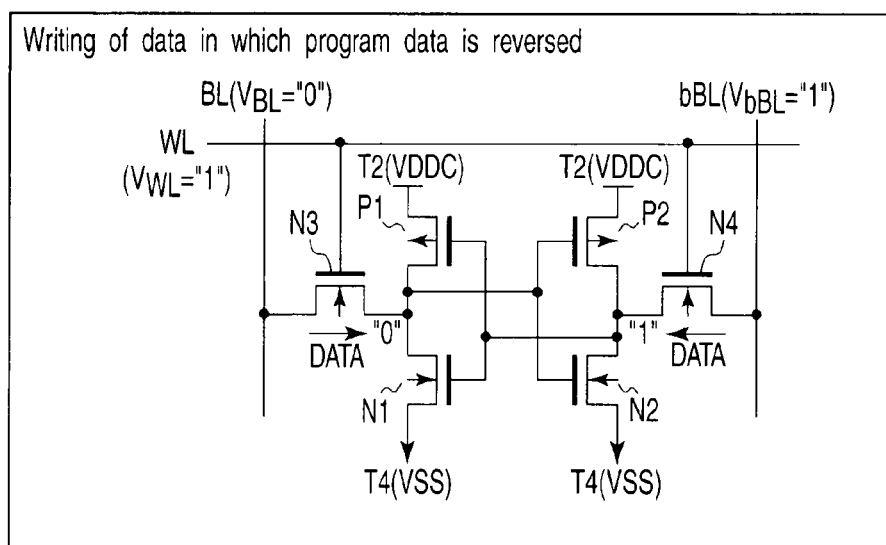
FIG. 4 is a diagram showing a cell state at the reverse data writing time.

For example, as shown in FIG. 4, the power source voltage VDDC is applied to the power source terminal T2 and voltage $V_{WL}$ of the word line WL is set to "1 (=VDD)" to turn ON the N-channel MOSFETs N3, N4. At this time, data of the paired bit lines BL, bBL is latched in the SRAM cell and thus data is written into the SRAM cell.

In this example, it is assumed that the program data is "1" and data "0" which is reverse to the program data is written into the SRAM cell. That is, voltage $V_{BL}$ of the bit line BL is set to "0 (VSS)" and voltage $V_{bBL}$ of the bit line bBL is set to "1". Then, the state in which the input signal to the right-side inverter in the SRAM cell is set at "0" and the input signal to the left-side inverter is set at "1" is maintained.

At the write time, the power source voltage VDD may be applied instead of the power source voltage VDDC as voltage applied to the power source terminal T2.

Next, stress is applied to the SRAM cell in the state in which data that is reverse to the program data is written into the SRAM cell.

Figure 5:
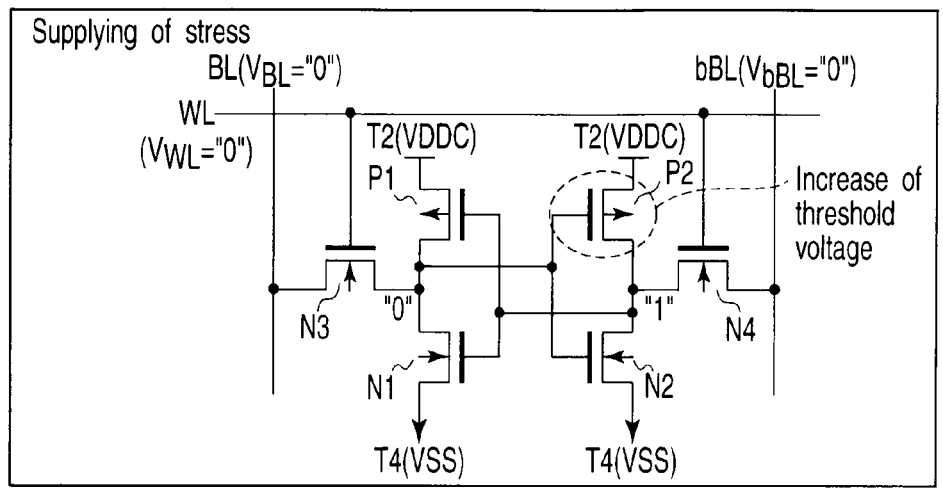
FIG. 5 is a diagram showing a cell state at the stress application time.

For example, as shown in FIG. 5, the power source voltage VDDC is applied to the power source terminal T2 and the voltage $V_{WL}$ of the word line WL is set to "0" to turn OFF the N-channel MOSFETs N3, N4. Further, both of the voltages $V_{BL}$, $V_{bBL}$ of the paired bit lines BL, bBL are set to "0".

At this time, since the gate voltage of the P-channel MOSFET P2 of the right-side inverter is "0", high voltage is applied between the gate and source of the P-channel MOSFET P2. In a period of time in which the high voltage is applied, a shift in the threshold voltage of the P-channel MOSFET P2 caused by NBTI becomes significant.

Specifically, the threshold voltage of the P-channel MOSFET P2 is raised.

Thus, the threshold voltage of one of the P-channel MOSFETs P1 and P2 acting as the loads whose gate voltage is set at "0" becomes higher than the threshold voltage of the other MOSFET whose gate voltage is set at "1".

In order to accelerate NBTI caused by application of stress, the chip temperature in the period of this step may be set higher than room temperature.

Further, during the stress application time, it is also possible to set a semiconductor area (for example, N-type well) in which the P-channel MOSFETs P1, P2 are formed to the power source voltage VDDC and accelerate NBTI.

In the stress application step, data written in the SRAM cell is not changed, but in practice, program data "1" is programmed in the SRAM cell in this step.

Next, the present address ADD is confirmed and if the address ADD is not a final address, the address ADD is incremented by "1" and then the operation of the steps ST2 to ST3 is performed again (steps ST4 to ST5).

If the present address ADD is a final address, the program operation is terminated (step ST4).

After this, the power source of the semiconductor integrated circuit (semiconductor chip) is turned OFF, data which is reverse to program data written into the SRAM cell is erased.

(4) Read

A method for reading data programmed in the SRAM cell by the above programming operation is explained.

It is assumed that "1" is programmed in the SRAM cell.

First, the power source of the semiconductor integrated circuit (semiconductor chip) is turned ON.

Figure 6:
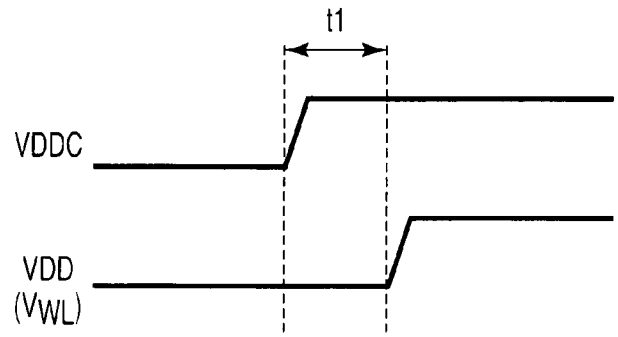
FIG. 6 is a diagram showing an example of waveforms at the read time.

Specifically, as shown in FIG. 6, the power source voltage VDDC is first supplied to the programmable ROM.

In this situation, as explained in the programming operation, the threshold voltages of the P-channel MOSFETs P1, P2 are different from each other. That is, the threshold voltage Vth(P2) of the P-channel MOSFET P2 is set higher than the threshold voltage Vth(P1) of the P-channel MOSFET P1.

Figure 9:
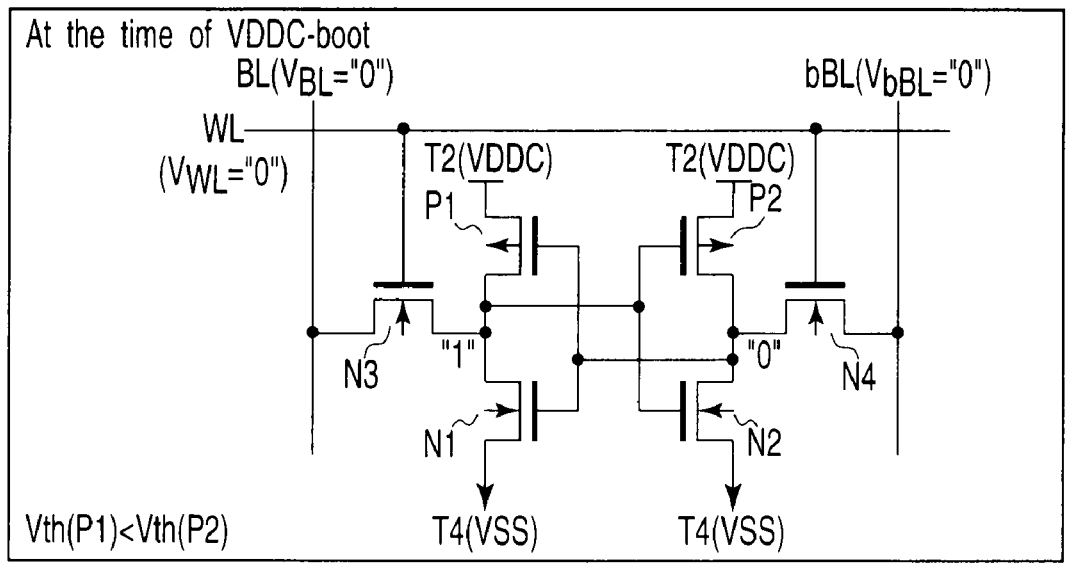
FIG. 9 is a diagram showing a cell state at the power-ON time.

Due to the unbalance of the threshold voltages, for example, as shown in FIG. 9, the initial state of the SRAM cell at the power-ON time (at the time of VDDC-boot) is so set that the input signal to the right-side inverter will be kept set at "1" and the input signal to the left-side inverter will be kept set at "0". This is the state in which program data "1" is programmed in the SRAM cell.

If a preset period of time t1 is set after the power source voltage VDDC is raised and then data of the SRAM cell is set into a more stable state, as shown in FIG. 6, the power source voltage VDD which drives the internal circuit is raised.

Figure 10:
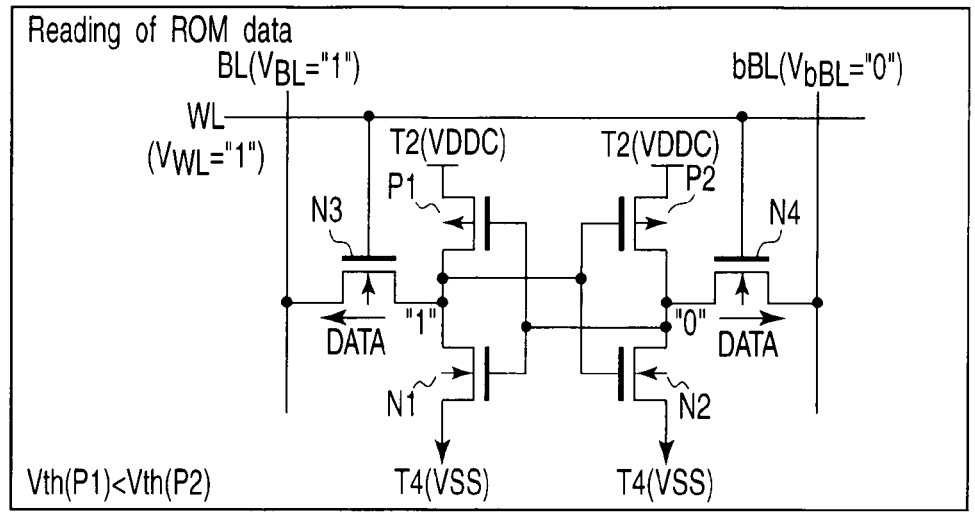
FIG. 10 is a diagram showing a cell state at the ROM data read time.

For example, as shown in FIG. 10, the voltage $V_{WL}$ of the word line WL is set to "1" and data stored in the SRAM cell is read and supplied to the paired bit lines BL, bBL.

Figure 7:
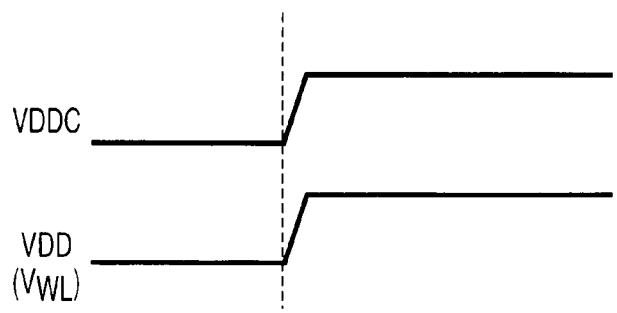
FIG. 7 is a diagram showing an example of waveforms at the read time.

The timings at which the power source voltages VDDC, VDD are raised may be set to the same timing as shown in FIG. 7.

Figure 8:
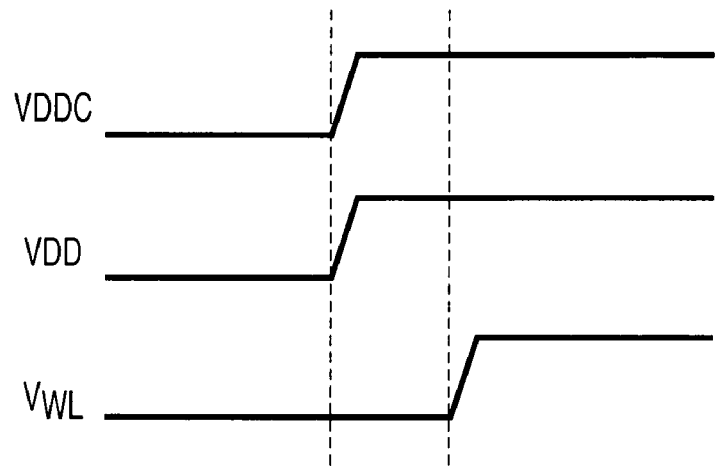
FIG. 8 is a diagram showing an example of waveforms at the read time.

Further, as shown in FIG. 8, even if the timings at which the power source voltages VDDC, VDD are raised are set to the same timing, data of the SRAM cell in the initial state can be made more stable by delaying the timing at which the voltage $V_{WL}$ of the word line WL is raised with respect to the timing at which the power source voltages VDDC, VDD are raised.

(5) Modification

A modification in which time required for the data programming operation with respect to the programmable ROM is shortened is explained.

Figure 11:
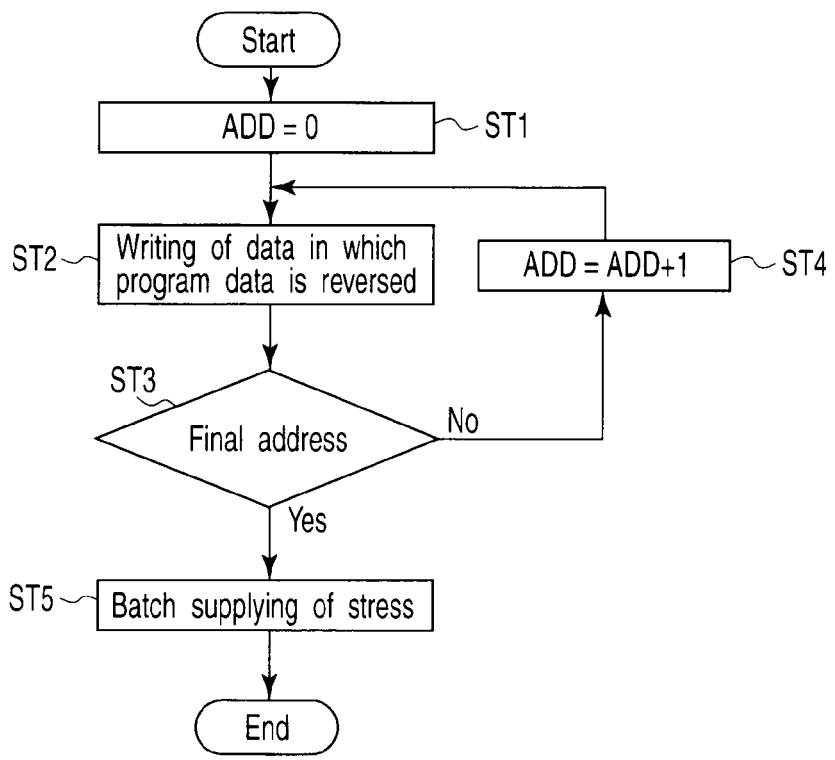
FIG. 11 is a diagram showing the flow of ROM data programming.

FIG. 11 shows a flowchart for programming.

The feature of this modification is that stress is simultaneously applied to all of a plurality of SRAM cells in the SRAM array.

First, an address of the programmable ROM (SRAM array) is set to an initial address (ADD=0) (step ST1).

Then, the operation of writing data that is reverse with respect to program data into an SRAM cell specified by the initial address is performed (step ST2).

Figure 3:
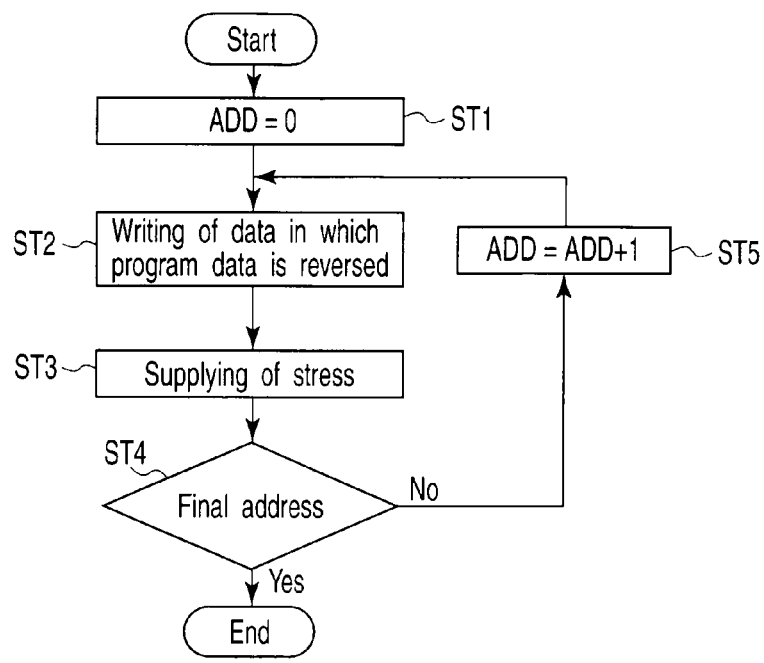
FIG. 3 is a diagram showing the flow of ROM data programming.

The write operation is performed by use of a method that is the same as the method explained in FIGS. 3 and 4.

Next, the present address ADD is confirmed and if the address ADD is not a final address, the address ADD is incremented by "1" and then the operation of the step ST2 is performed again (steps ST3 to ST4).

If the present address ADD is a final address, stress is simultaneously applied to all of the SRAM cells (step ST5).

The stress applying operation is performed by use of a method that is the same as the method explained in FIGS. 3 and 5.

Also, in this modification, in order to accelerate NBTI caused by stress application, the chip temperature in the period of this step may be set higher than room temperature.

Further, during the stress application time, it is also possible to set a semiconductor area (for example, N-type well) in which the P-channel MOSFETs P1, P2 are formed to the power source voltage VDDC and accelerate NBTI.

Thus, ROM data is programmed into the SRAM cells.

After this, the program operation is terminated.

In the modification, since stress is simultaneously applied, program time for programming ROM data into the programmable ROM can be shortened.

(6) Others

Thus, in the present invention, the magnitude relation of the threshold voltages of the paired field effect transistors acting as loads is determined according to ROM data by utilizing the principle of a variation in the threshold voltage caused by NBTI. Thus, the SRAM can be used as a programmable ROM without making the control circuit complicated and increasing the manufacturing cost.

3. Application Example

In the above embodiment, it is supposed that the SRAM (programmable ROM) is arranged in part of the semiconductor chip. In this situation, ROM data is latched in the latch circuit and used to control the internal circuit or the like in the semiconductor integrated circuit (semiconductor chip) in which the SRAM is formed.

In this example, a ROM chip is explained.

Figure 13:
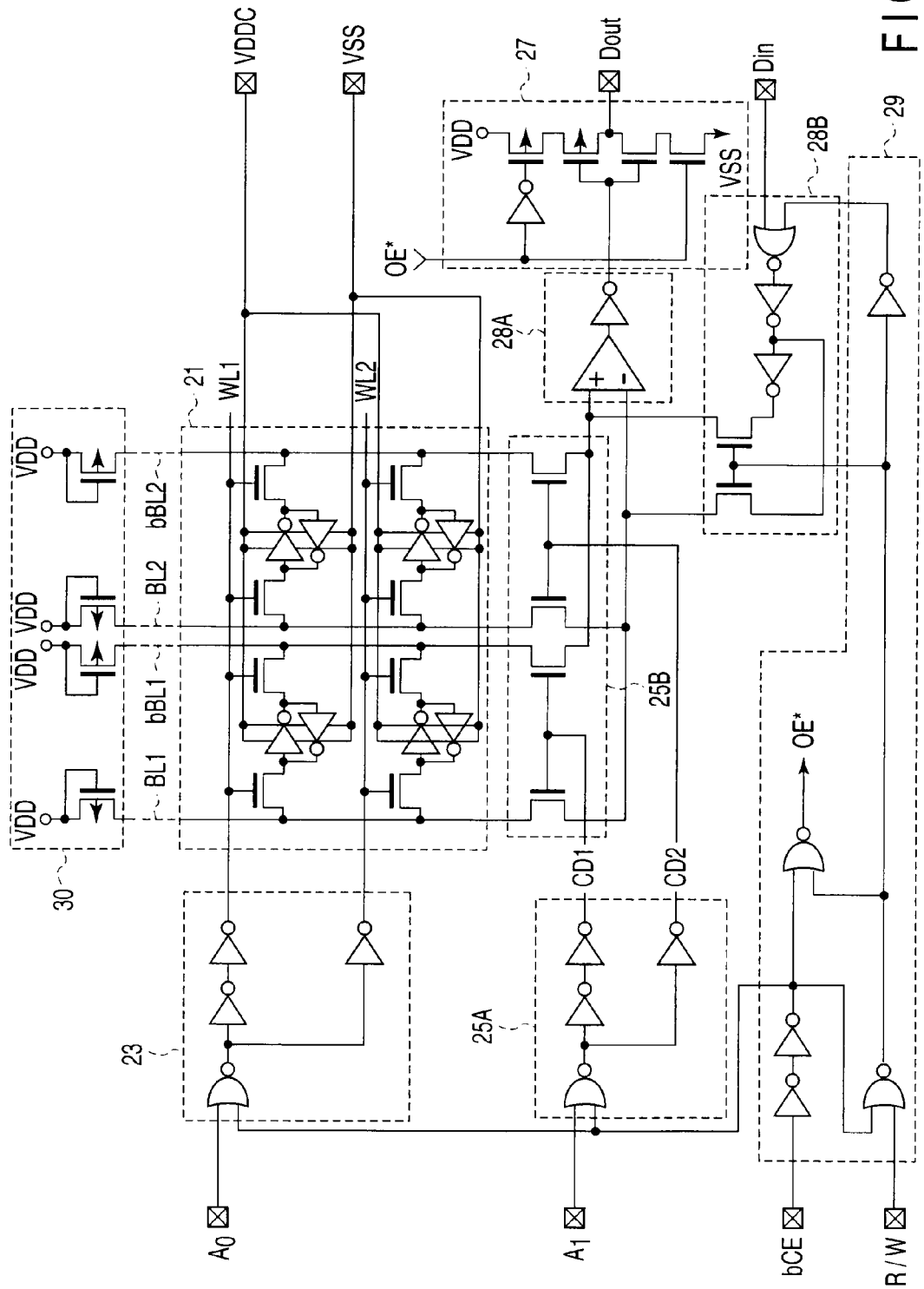
FIG. 13 is a diagram showing an example of the circuit of the ROM chip.

FIGS. 12 and 13 show a ROM chip of this invention.

A row address buffer 22 and row decoder 23 are arranged on one side of a memory cell array 21 including a plurality of SRAM cells in a row direction. Further, a column address buffer 24 and column decoder/column selector 25 are arranged on one side of the memory cell array 21 in a column direction.

Row address signals $A_0, \ldots, A_{n-1}$ are input to the row decoder 23 via the row address buffer 22. Further, column address signals $A_n, \ldots, A_{N-1}$ are input to the column decoder/column selector 25 (25A, 25B) via the column address buffer 24.

The programming operation is performed only once by supplying ROM data $D_{in}$ to the memory cell array 21 via a data input buffer 26. Further, ROM data $D_{out}$ stored in the memory cell array is read to the exterior of the ROM chip via a data output buffer 27.

A sense amplifier/write buffer 28 (28A, 28B) is arranged between the memory cell array 21 and the column decoder/column selector 25. The sense amplifier 28A is configured by a differential amplifier as shown in FIG. 14, for example.

The control circuit 29 controls the programming and read operations of ROM data based on a chip enable signal bCE and read/write signal R/W.

A load circuit 30 acting as a load at the read time is connected to bit lines BL1, bBL1, BL2, bBL2.

In this example, in the ROM chip of this invention, the power source voltage VDDC is directly supplied from the power source terminal T2 to the memory cell array (SRAM cell).

Further, the control circuit 29 performs the programming operation of ROM data according to the sequence of FIG. 3 or 11 and reads ROM data according to the waveform diagrams of FIG. 6, 7 or 8.

In this application example, the circuit other than the memory cell array 21 and control circuit 29 is defined as the internal circuit. In the present invention, the power source voltage VDDC applied to the power source terminal T2 is not supplied to the internal circuit. On the other hand, the power source voltage VDD applied to the power source terminal T1 is supplied to the internal circuit to drive the internal circuit.

The power source voltage VSS applied to the power source terminal T4 is ground voltage, for example.

This invention can be applied to the above ROM chip.

4. Improvement Example

In this invention, the ROM data programming operation is performed by utilizing a variation in the threshold voltages of the field effect transistors in the SRAM cell caused by NBTI. In this situation, NBTI indicates a phenomenon that the threshold voltage of the field effect transistor varies in such a direction that data held in the SRAM cell is lost. So, in this invention, the programming operation is performed by stress application in a state in which data that is reverse with respect to program data is held in the SRAM cell.

However, this means that a variation in the threshold voltage of the field effect transistor in the SRAM cell caused by NBTI occurs in such a direction that ROM data is lost each time ROM data is read from the SRAM cell after the ROM data is programmed into the SRAM cell.

Figure 16:
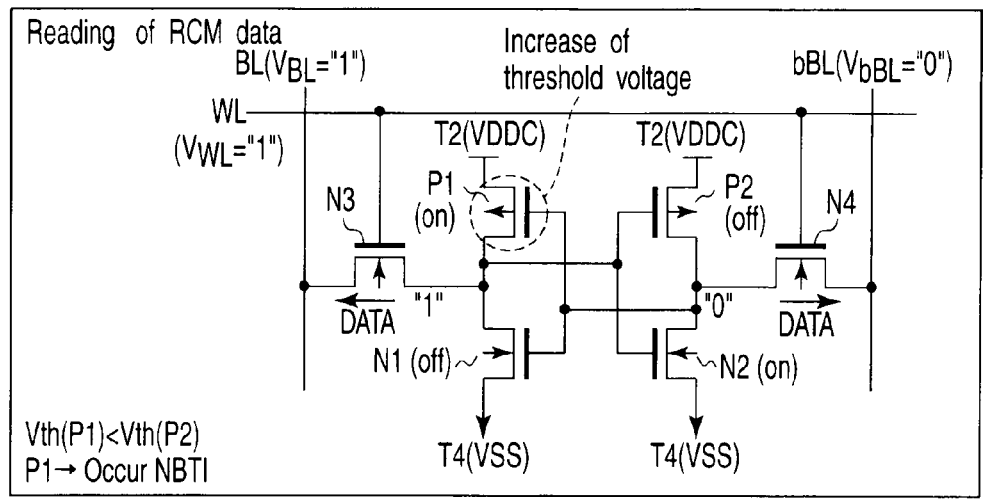
FIG. 16 is a diagram for illustrating NBTI at the read time.

For example, as shown in FIG. 15, in the programmed state, when the threshold voltage of the P-channel MOSFET P2 in the SRAM cell is set higher than the threshold voltage of the P-channel MOSFET P1, NBTI occurs in such a direction that the threshold voltage of the P-channel MOSFET P1 is enhanced at the read time as shown in FIG. 16.

Therefore, if this is left as it is, ROM data programmed in the SRAM cell is finally lost and the reliability thereof as the programmable ROM is lost.

The improvement example explained here is a technique for making it difficult to cause a variation in the threshold voltage of the field effect transistor in the SRAM cell caused by NBTI to occur after ROM data is programmed into the SRAM cell in order to prevent ROM data from being lost and enhance the reliability of the programmable ROM.

More specifically, a switch circuit that determines a period in which the SRAM cell and the power source terminal are short-circuited is connected between the power source terminal and the memory cell array and a latch circuit that latches ROM data is additionally provided. The power source terminal is disconnected from the SRAM cell immediately after ROM data is latched in the latch circuit at the ROM data read time.

Thus, the period in which NBTI occurs in the SRAM cell is suppressed to minimum after ROM data is programmed and the ROM data can be prevented from being lost.

Figure 17:
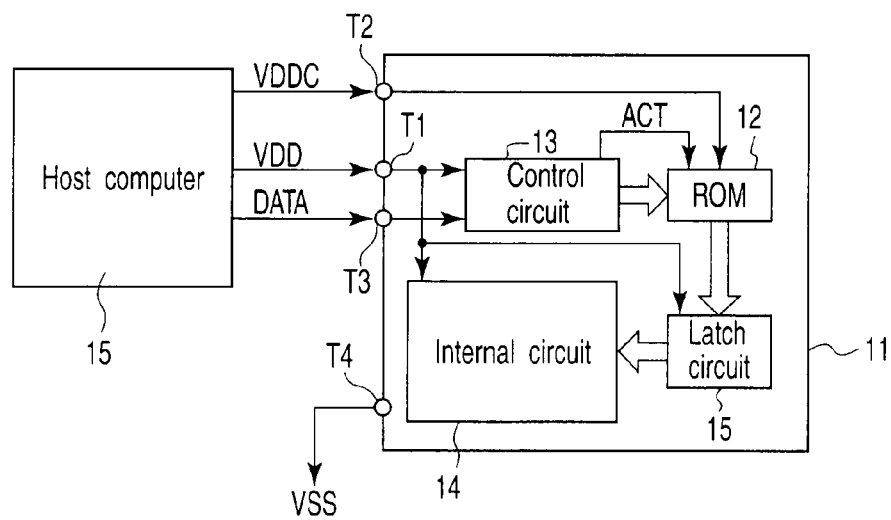
FIG. 17 is a diagram showing a first example of a system associated with an improvement example.

FIG. 17 shows a first example of a system associated with the improvement example.

A semiconductor integrated circuit (semiconductor chip) 11 is a microcomputer, system LSI, memory, logic LSI or the like. In the semiconductor integrated circuit 11, a programmable ROM 12, control circuit 13, internal circuit 14 and latch circuit 15 are arranged.

The programmable ROM 12 includes SRAM cells and stores program data used to control the operation of the internal circuit 14 and trimming data used to adjust the characteristic of the internal circuit 14. The control circuit 13 controls the program/read operation for the programmable ROM 12. The internal circuit 14 includes elements corresponding to the type of the semiconductor integrated circuit 11.

A host computer 15 supplies program data DATA and power source voltages VDD, VDDC required for the program/read operation of ROM data with respect to the programmable ROM 12 to the semiconductor integrated circuit 11.

The power source voltage VDD is voltage to drive the control circuit 13 and internal circuit 14 and is supplied to a power source terminal T1. The power source voltage VDDC is voltage different from the power source voltage VDD, for example, voltage higher than the power source voltage VDD and is directly supplied to the programmable ROM 12 via a power source terminal T2.

The power source terminal T2 is not connected to the internal circuit 14.

The program data DATA is supplied to a data input terminal T3.

Power source voltage VSS is voltage lower than the power source voltages VDD, VDDC, for example, ground voltage and is supplied to a power source terminal T4.

A difference between the power source voltages VDDC and VSS is larger than a difference between the power source voltages VDD and VSS.

The latch circuit 15 latches ROM data read from the programmable ROM 12. The state of the internal circuit 14 is controlled based on ROM data latched in the latch circuit 15.

The program/read operation with respect to the programmable ROM 12 is controlled according to an active signal ACT. The active signal ACT is supplied from the control circuit 13 to the programmable ROM 12. In this situation, it is possible to supply the active signal ACT from the host computer 15 to the programmable ROM 12 instead of the above situation.

Figure 18:
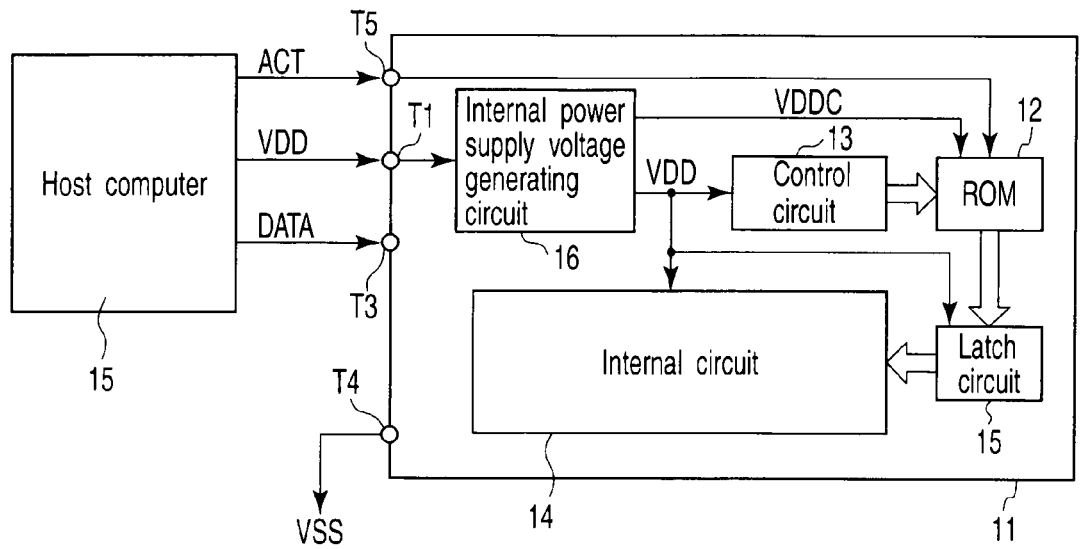
FIG. 18 is a diagram showing a second example of the system associated with the improvement example.

FIG. 18 shows a second example of the system associated with the improvement example.

The second example is largely different from the first example in that the power source voltage VDDC is generated in the internal portion of the semiconductor integrated circuit 11.

The power source voltage VDD is supplied from the host computer 15 to the semiconductor integrated circuit 11. An internal power source voltage generation circuit 16 generates power source voltage VDDC based on the power source voltage VDD. For example, the internal power source voltage generation circuit 16 includes a booster circuit and generates the power source voltage VDDC by use of the booster circuit.

Further, the active signal ACT is supplied from the host computer 15 to the programmable ROM 12 via a control signal input terminal T5. However, it is possible to supply the active signal ACT from the control circuit 13 to the programmable ROM 12 instead of the above situation.

The other configuration is the same as that of the first example, and therefore, the explanation thereof is omitted here.

Figure 19:
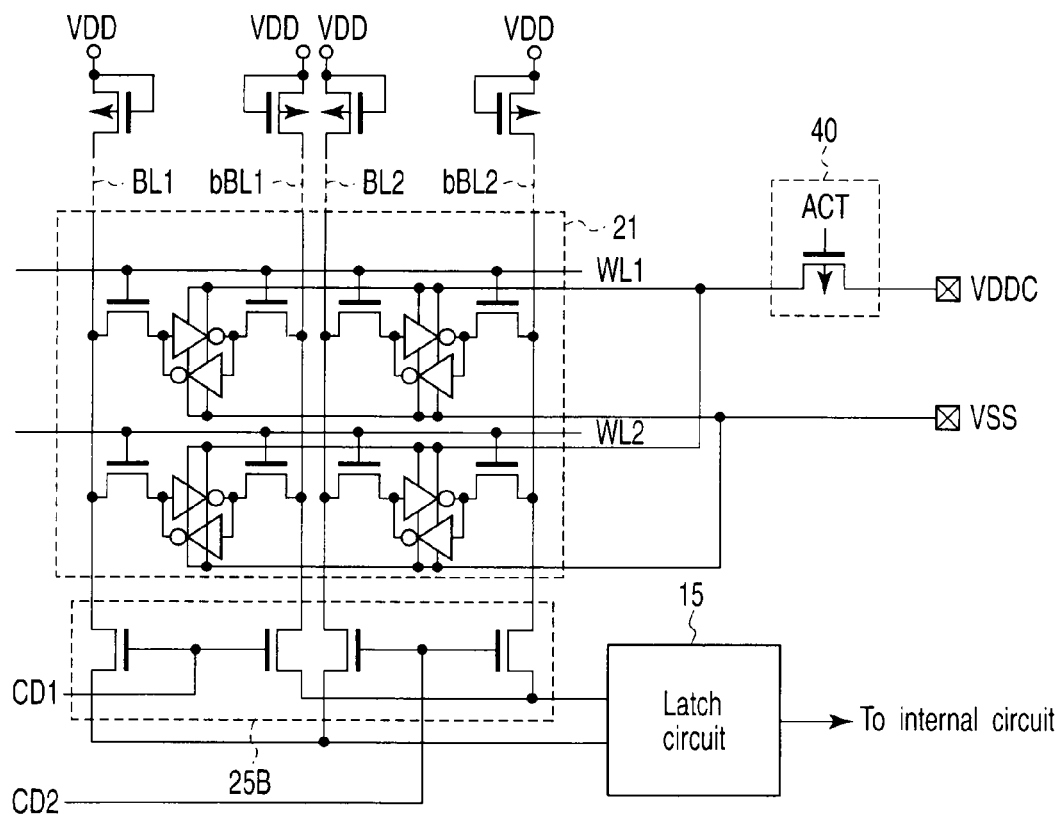
FIG. 19 is a diagram showing an example of a switch circuit.

FIG. 19 shows an example of a switch circuit that determines a period in which the power source voltage is supplied to the SRAM cell.

A switch circuit 40 that determines a period in which the SRAM cell and the power source terminal VDDC are short-circuited is connected between the power source terminal VDDC and the memory cell array 21. The switch circuit 40 is configured by a P-channel MOSFET and the active signal ACT is input to the gate thereof. When the active signal ACT is set at "L", the power source terminal VDDC is short-circuited to the SRAM cell. Then, the active signal ACT is set to "H" to disconnect the power source terminal VDDC from the SRAM cell immediately after ROM data is latched in the latch circuit 15.

Figure 20:
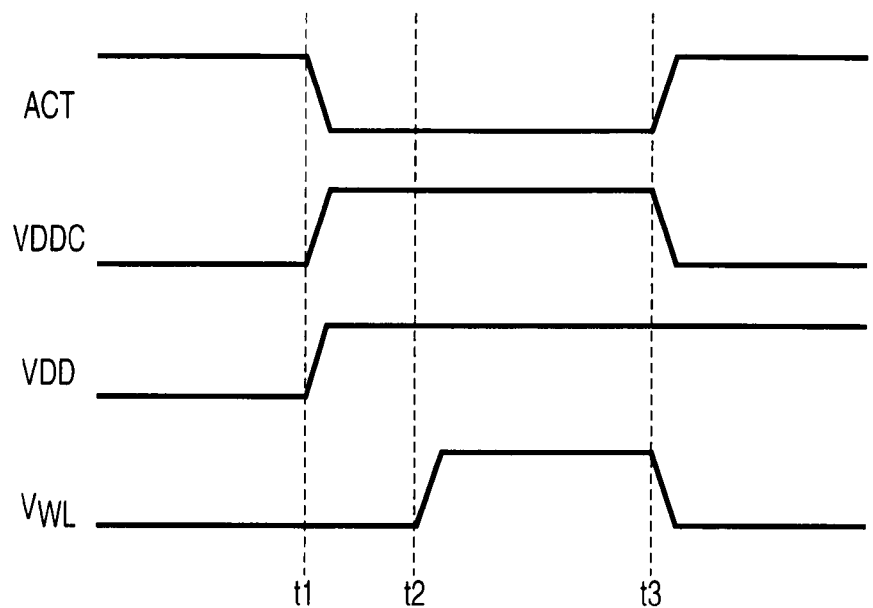
FIG. 20 is a timing diagram showing an example in which the read period of ROM data is limited.

FIG. 20 shows a first example of timing at which ROM data is read.

The first example is an example in which ROM data is read at the boot time in which the power source voltage VDD is supplied to the semiconductor integrated circuit.

First, at time t1, the power source voltages VDD, VDDC are raised and the active signal ACT is activated (in this example, lowered). Further, at time t2, if the potential $V_{WL}$ of the word line is raised, ROM data is read. The ROM data is immediately latched in the latch circuit.

At time t3 immediately after the ROM data is latched in the latch circuit, the active signal ACT is deactivated (in this example, raised). If the active signal ACT is deactivated, stress is not applied to the SRAM, and therefore, no NBTI occurs.

The timing at which the potential $V_{WL}$ of the word line is lowered may be set to timing before or after the time t3.

Figure 21:
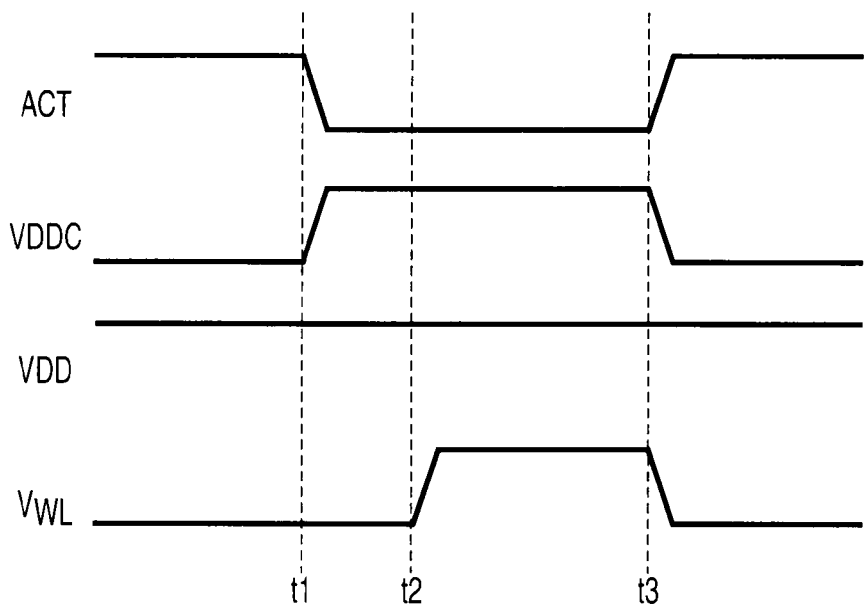
FIG. 21 is a timing diagram showing an example in which the read period of ROM data is limited.

FIG. 21 shows a second example of a period in which ROM data is read.

The second example is an example in which ROM data is read during the operation of the semiconductor integrated circuit. Since the semiconductor integrated circuit is being operated, the power source voltage VDD is set in a raised state.

First, at time t1, the power source voltage VDDC is raised and the active signal ACT is activated (in this example, lowered). Further, if the potential $V_{WL}$ of the word line is raised at time t2, ROM data is read. The ROM data is immediately latched in the latch circuit.

At time t3 immediately after the ROM data is latched in the latch circuit, the active signal ACT is deactivated (in this example, raised). If the active signal ACT is deactivated, stress is not applied to the SRAM, and therefore, no NBTI occurs.

The timing at which the potential $V_{WL}$ of the word line is lowered may be set to timing before or after the time t3.

In the above improvement example, the switch circuit is connected between the power source terminal to which the power source voltage VDDC is applied and the memory cell array, but the following modifications can be made.

First, a switch circuit may be connected between a power source terminal to which the power source voltage (for example, 0V) VSS is applied and the memory cell array in addition to the improvement example. In this situation, the switch circuit is configured by an N-channel MOSFET. Further, an active signal bACT is input to the gate of the N-channel MOSFET.

Secondly, a switch circuit may be connected between the power source terminal to which the power source voltage VDDC is applied and the memory cell array and a switch circuit may be connected between the power source terminal to which the power source voltage VSS is applied and the memory cell array. In this situation, the switch circuit on the power source voltage VDDC side is controlled by the active signal ACT and the switch circuit on the power source voltage VSS side is controlled by the active signal bACT. At this time, the active signal bACT is set as an inverted signal of the active signal ACT.

In either situation, when the active signal ACT is set at "L" and the active signal bACT is set at "H", the program/read operation of ROM data is performed. Further, when the active signal ACT is set at "H" and the active signal bACT is set at "L", no stress is applied to the SRAM cell and the program/read operation of ROM data is inhibited.

As is explained above, according to the improvement example, a variation in the threshold voltage of the field effect transistor in the SRAM cell caused by NBTI is made difficult to occur after ROM data is programmed into the SRAM cell. Thus, ROM data can be prevented from being lost and the reliability of the programmable ROM can be enhanced.

5. PLA

The programmable ROM of this invention can be applied to a PLA (programmable logic array).

Figure 23:
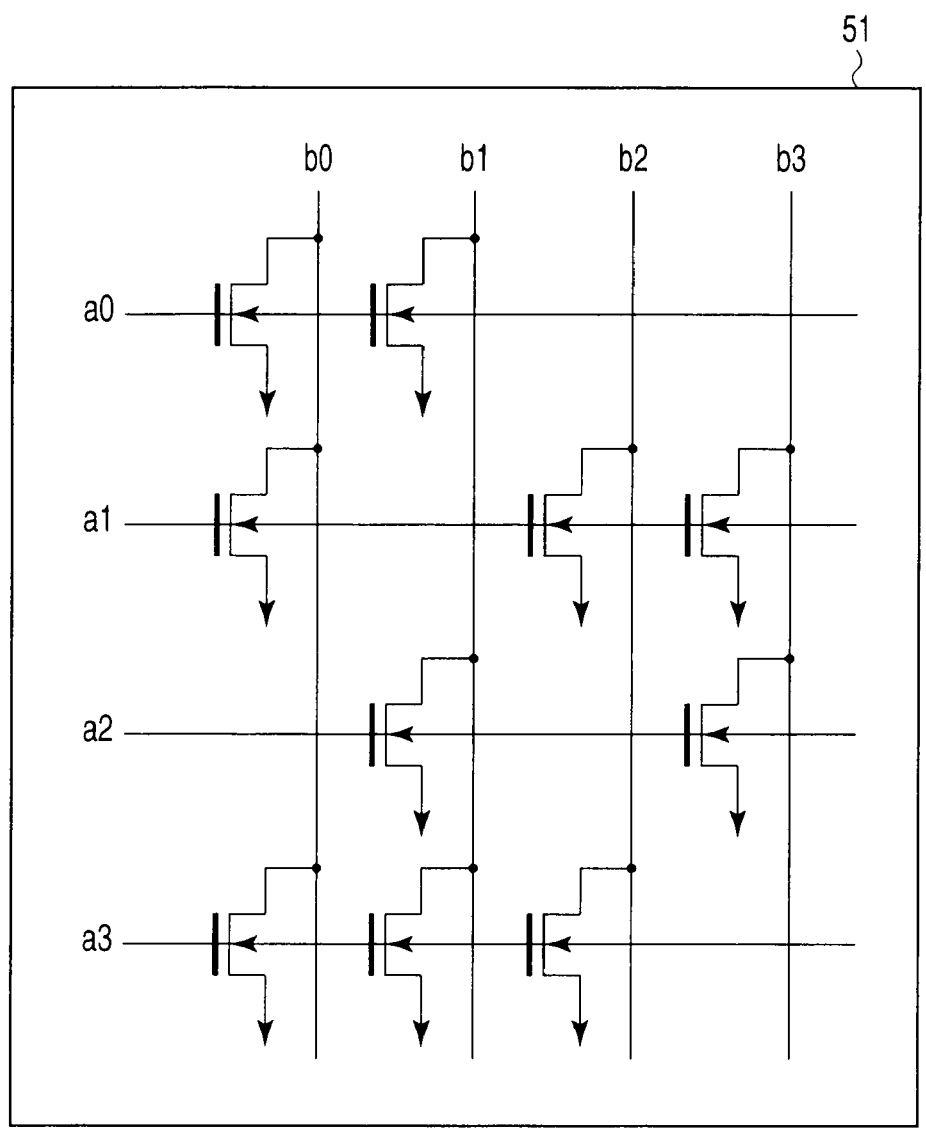
FIG. 23 is a diagram showing a PLA.

As shown in FIG. 22, a PLA 51 has a function of converting logic signals a0, a1, ..., a3 to logic signals b0, b1, ..., b3 and converting the logic signals b0, b1, ..., b3 to logic signals c0, c1, ..., c3. Further, as shown in FIG. 23, the PLA 51 includes ROM cells (N-channel MOSFETS), for example.

The ROM cells are replaced by the programmable ROM of this invention.

FIG. 24 is a diagram showing a PLA system.

A semiconductor integrated circuit (PLA chip) 11 includes a control circuit 13 and PLA 17.

The PLA 17 is configured by the programmable ROM (SRAM cells) according to this invention. The control circuit 13 controls the program/read operation for the PLA 17.

A host computer 15 supplies program data DATA and power source voltages VDD, VDDC required for the program/read operation of ROM data for the PLA 17 to the semiconductor integrated circuit 11.

The power source voltage VDD is voltage to drive the control circuit 13 and PLA 17 and supplied to a power source terminal T1. The power source voltage VDDC is voltage different from the power source voltage VDD, for example, voltage higher than the power source voltage VDD and is directly supplied to the PLA 17 via a power source terminal T2.

The program data DATA is supplied to a data input terminal T3.

Power source voltage VSS is voltage lower than the power source voltages VDD, VDDC, for example, ground voltage and is supplied to a power source terminal T4.

A difference between the power source voltages VDDC and VSS is larger than a difference between the power source voltages VDD and VSS.

First, a first example of the PLA is explained.

In explaining the configuration of the PLA, the following symbols are used in order to simplify the explanation.

Figure 25:
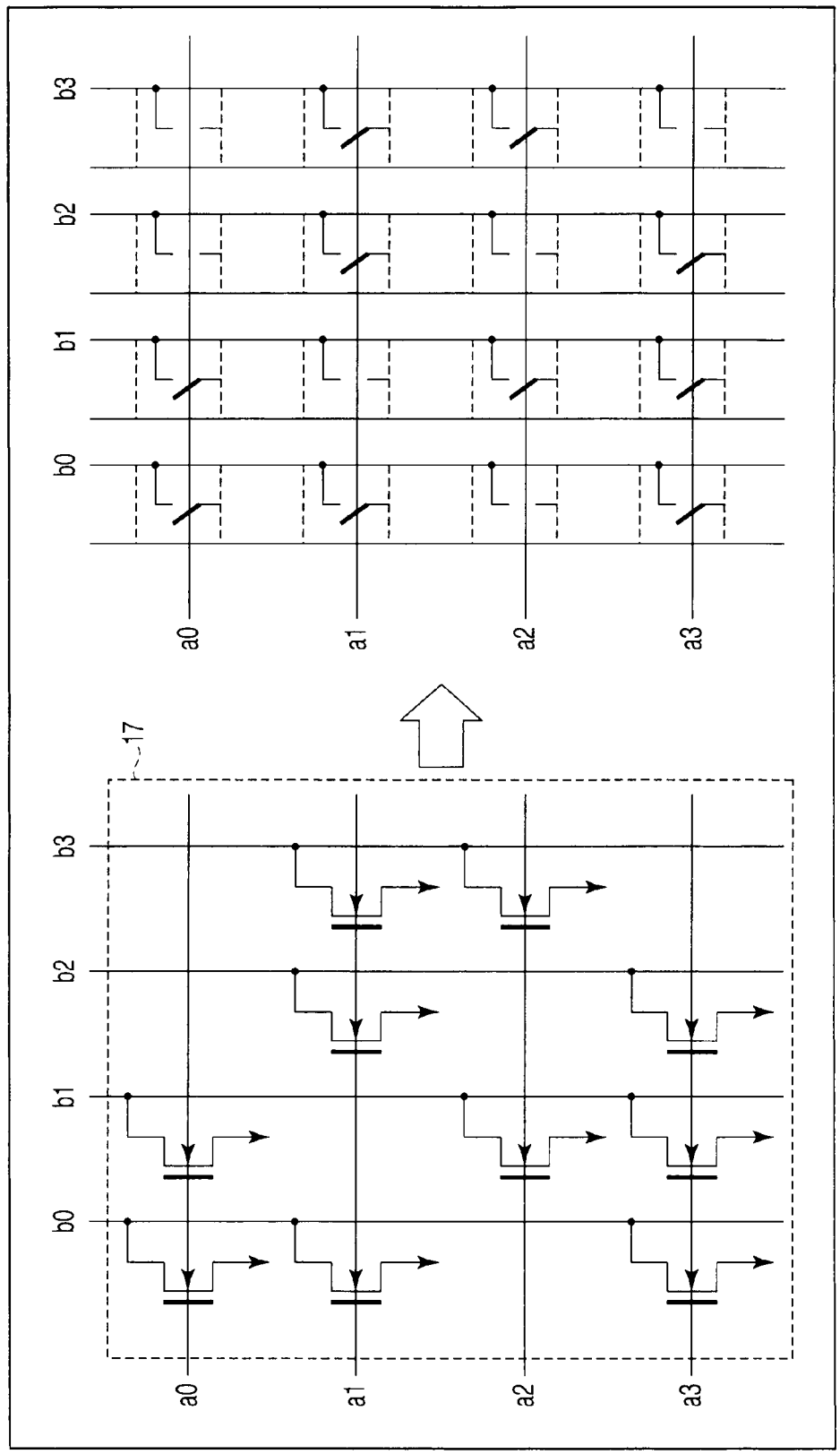
FIG. 25 is a diagram showing symbols expressing ROM cells.

First, as shown in FIG. 25, ROM cells configuring the PLA 17 on the left portion of FIG. 25 are expressed by symbols indicated on the right portion. There are two types of symbols and the concrete configurations thereof are shown in FIG. 26.

Figure 26:
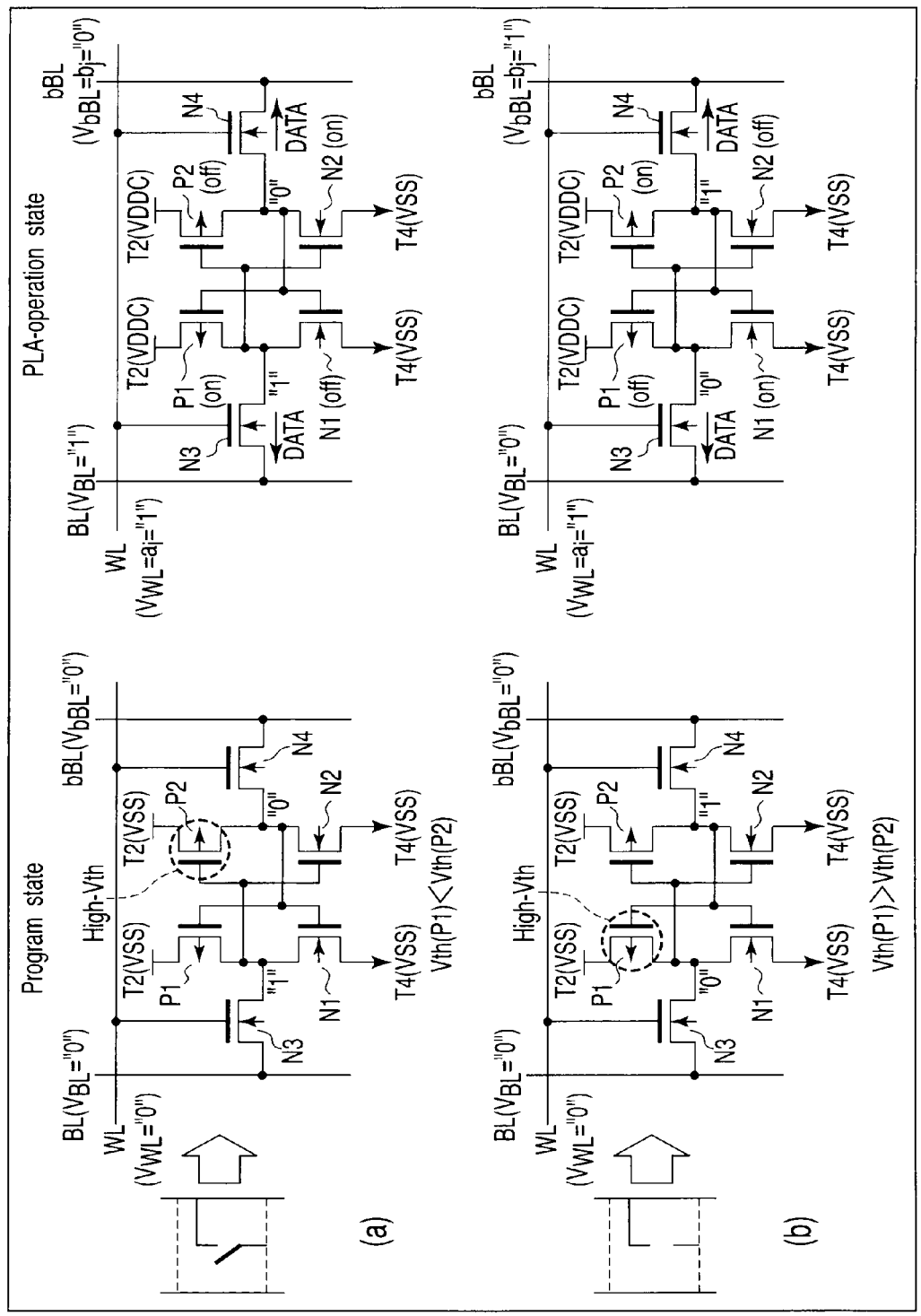
FIG. 26 is a diagram showing a first example of ROM cells in a PLA.

FIG. 26($a$) shows a situation wherein an N-channel MOSFET acting as a switch circuit is present. When the PLA is set to correspond to the programmable ROM of this invention, this situation corresponds to a situation wherein the threshold voltage Vth(P2) of the P-channel MOSFET P2 is set higher than the threshold voltage Vth(P1) of the P-channel MOSFET P1.

At the PLA operation time, an input signal ai is input to the word line WL and an output signal bj is output from the bit line bBL. A signal output to the bit line BL is not used at the PLA operation time. At the programming time, program data is input via the two bit lines BL, bBL.

In this situation, at the PLA operation time, the output signal bj is set to "0 (=L)" when the input signal ai is set at "1 (=H)", for example.

FIG. 26($b$) shows a situation wherein an N-channel MOSFET acting as a switch circuit is not present. When the PLA is set to correspond to the programmable ROM of this invention, this situation corresponds to a situation wherein the threshold voltage Vth(P1) of the P-channel MOSFET P1 is set higher than the threshold voltage Vth(P2) of the P-channel MOSFET P2.

At the PLA operation time, an input signal ai is input to the word line WL and an output signal bj is output from the bit line bBL. A signal output to the bit line BL is not used at the PLA operation time. At the programming time, program data is input via the two bit lines BL, bBL.

In this situation, at the PLA operation time, the output signal bj is set to "1 (=H)" when the input signal ai is set at "1 (=H)", for example.

FIG. 27 shows the concrete configuration of the PLA of the first example.

Multiplexers 53 are connected to one-side ends of the word lines WL0, WL1, . . . , WL3. One-side input terminals of the multiplexers 53 are connected to a row decoder 54 and input signals a0, a1, . . . , a3 are input to the other input terminals thereof.

The multiplexers 53 select one of the input signals a0, a1, . . . , a3 and the output signals of the row decoder 54 and output the selected signal based on a control signal CNT.

Write amplifiers (WA) 55 are connected to one-side ends of bit lines BLj, bBLj (j=0, 1, . . . , 3).

Buffers 56 are connected to one-side ends of the bit lines bBLj (j=0, 1, . . . , 3) and output signals b0, b1, . . . , b3 are output from the respective buffers 56.

At the ROM data programming time, the multiplexers 53 select the output signals of the row decoder 54. The row decoder 54 selects one of the word lines WL0, WL1, . . . , WL3 based on the write address signal. The selected one word line WLi is set to "1 (=H)".

Further, program data is output from the write amplifier 55 to the bit lines BLj, bBLj. Complementary data is output to the bit lines BLj, bBLj. For example, when the ROM cell is set into a state of FIG. 26($a$), the bit line BLj is set to "0" and the bit line bBLj is set to "1". Further, when the ROM cell is set into a state of FIG. 26($b$), the bit line BLj is set to "1" and the bit line bBLj is set to "0".

At the PLA operation time, the multiplexers 53 select the input signals a0, a1, . . . , a3. At this time, the write amplifiers 55 are deactivated. The output signals b0, b1, . . . , b3 are output from the buffers 56 connected to the bit lines bBLj.

Thus, the programmable ROM of this invention can be applied to the ROM cells of the PLA.

Next, a second example of the PLA is explained.

The feature of the second example lies in that the path of an input signal at the program time and the path of an input/output signal at the PLA operation time are made different unlike the situation of the first example.

FIG. 28($a$) shows a situation wherein an N-channel MOSFET acting as a switch circuit is present. When the PLA is set to correspond to the programmable ROM of this invention, this situation corresponds to a situation wherein the threshold voltage Vth(P2) of the P-channel MOSFET P2 is set higher than the threshold voltage Vth(P1) of the P-channel MOSFET P1.

FIG. 28($b$) shows a situation wherein an N-channel MOSFET acting as a switch circuit is not present. When the PLA is set to correspond to the programmable ROM of this invention, this situation corresponds to a situation wherein the threshold voltage Vth(P1) of the P-channel MOSFET P1 is set higher than the threshold voltage Vth(P2) of the P-channel MOSFET P2.

In the second example, each ROM cell (programmable ROM) further includes an N-channel MOSFET N5 having a gate connected to the gate of the N-channel MOSFET N2 and a source connected to the power source terminal T4 (VSS) and an N-channel MOSFET N6 having a gate connected to an input line IL(ai), a source connected to the drain of the N-channel MOSFET N5 and a drain connected to an output line OL(bj).

The input line IL and output line OL are newly provided in addition to the word line WL and bit lines BL, bBL. The word line WL and bit lines BL, bBL are used at the program time and the input line IL and output line OL are used at the PLA operation time.

Figure 29:
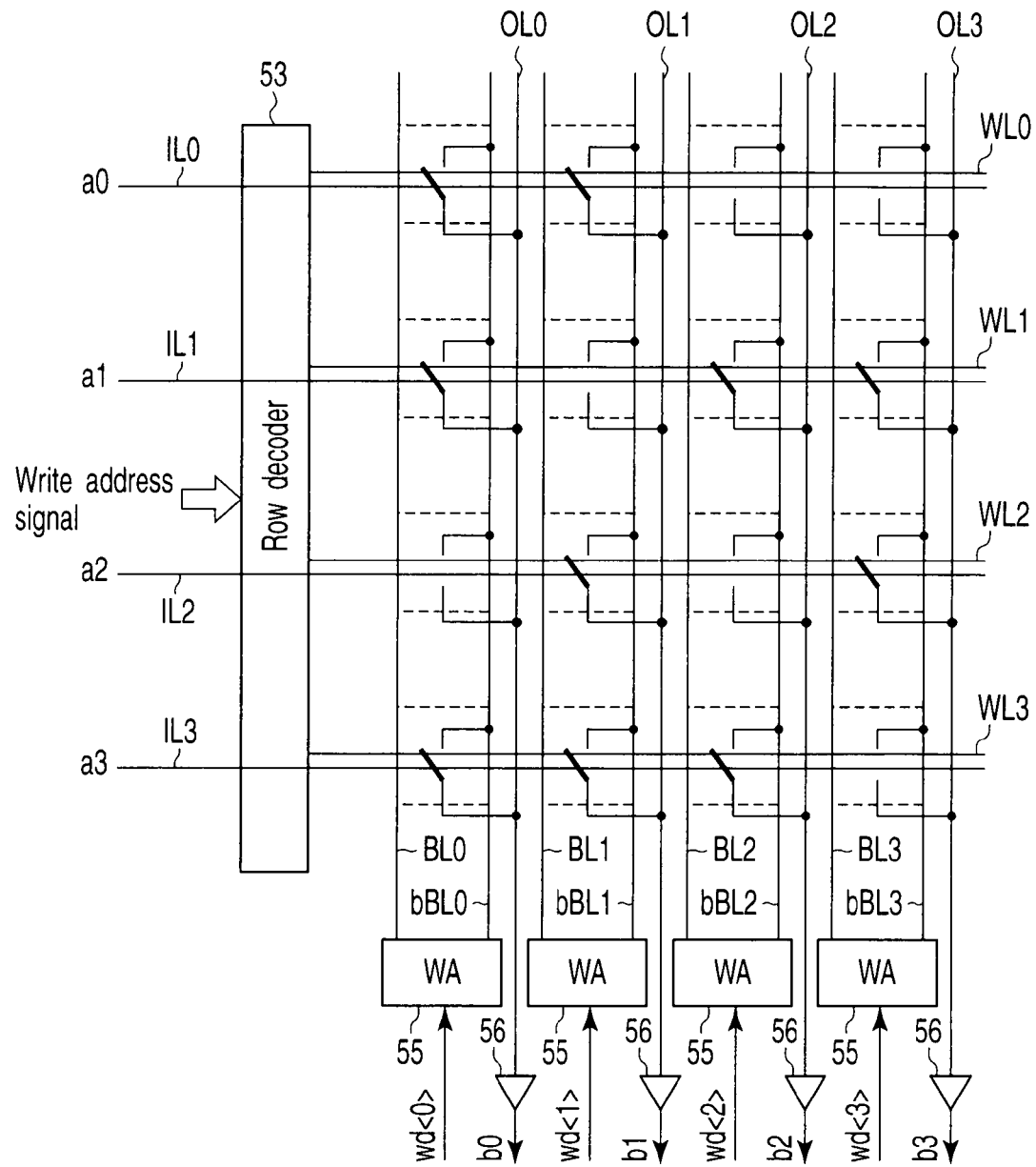
FIG. 29 is a diagram showing a second example of the PLA system.

FIG. 29 shows the concrete configuration of the PLA of the second example.

A row decoder 54 is connected to one-side ends of the word lines WL0, WL1, . . . , WL3. Write amplifiers (WA) 55 are connected to one-side ends of respective bit lines BLj, bBLj (j=0, 1, . . . , 3).

Input signals a0, a1, . . . , a3 are input to the input lines IL0, IL1, . . . , IL3, buffers 56 are connected to one-side ends of the output lines OL0, OL1, . . . , OL3 and output signals b0, b1, . . . , b3 are output from the respective buffers 56.

At the ROM data programming time, the row decoder 54 is activated. The row decoder 54 selects one of the word lines WL0, WL1, . . . , WL3 based on a write address signal. The selected one word line WLi is set to "1 (=H)".

Further, program data is output from the write amplifier 55 to the bit lines BLj, bBLj. Like the first example, complementary data is output to the bit lines BLj, bBLj.

At the PLA operation time, the row decoder 54 and write amplifiers 55 are deactivated. The input signals a0, a1, . . . , a3 are input to the input lines IL0, IL1, IL3. The output signals b0, b1, ..., b3 are output from the buffers 56 connected to the output lines OL0, OL1, ..., OL3.

Thus, the programmable ROM of this invention can be applied to the ROM cells of the PLA.

Next, a third example of the PLA is explained.

The third example is a modification of the second example and is featured in that part of the path of an input signal at the program time and part of the path of an output signal at the PLA operation time are commonly used.

FIG. 30(a) shows a situation wherein an N-channel MOSFET acting as a switch circuit is present. When the PLA is set to correspond to the programmable ROM of this invention, this situation corresponds to a situation wherein the threshold voltage Vth(P2) of the P-channel MOSFET P2 is set higher than the threshold voltage Vth(P1) of the P-channel MOSFET P1.

FIG. 30(b) shows a situation wherein an N-channel MOSFET acting as a switch circuit is not present. When the PLA is set to correspond to the programmable ROM of this invention, this situation corresponds to a situation wherein the threshold voltage Vth(P1) of the P-channel MOSFET P1 is set higher than the threshold voltage Vth(P2) of the P-channel MOSFET P2.

In the third example, each ROM cell (programmable ROM) further includes an N-channel MOSFET N5 having a gate connected to the gate of the N-channel MOSFET N2 and a source connected to the power source terminal T4 (VSS) and an N-channel MOSFET N6 having a gate connected to an input line IL(ai), a source connected to the drain of the N-channel MOSFET N5 and a drain connected to a bit line bBLj(bj).

The input line IL is newly provided in addition to the word line WL. The word line WL is used at the program time and the input line IL is used at the PLA operation time. The bit lines BL, bBL are used at both of the program time and the PLA operation time. However, at the PLA operation time, only the bit line bBL is used.

FIG. 31 shows the concrete configuration of the PLA of the third example.

A row decoder 54 is connected to one-side ends of the word lines WL0, WL1, ..., WL3. Write amplifiers (WA) 55 are connected to one-side ends of bit lines BLj, bBLj (j=0, 1, ..., 3).

Input signals a0, a1, ..., a3 are input to the input lines IL0, IL1, ..., IL3, buffers 56 are connected to one-side ends of the bit lines bBLj (j=0, 1, ..., 3) and output signals b0, b1, ..., b3 are output from the respective buffers 56.

At the ROM data programming time, the row decoder 54 is activated. The row decoder 54 selects one of the word lines WL0, WL1, ..., WL3 based on a write address signal. The selected one word line WLi is set to "1 (=H)".

Further, program data is output from the write amplifier 55 to the bit lines BLj, bBLj. Like the first example, complementary data is output to the bit lines BLj, bBLj.

At the PLA operation time, the row decoder 54 and write amplifiers 55 are deactivated. The input signals a0, a1, ..., a3 are input to the input lines IL0, IL1, IL3. The output signals b0, b1, ..., b3 are output from the buffers 56 connected to the bit lines bBLj (j=0, 1, ..., 3).

Thus, the programmable ROM of this invention can be applied to the ROM cells of the PLA.

6. Conclusion

According to this invention, the SRAM can be used as the programmable ROM without making the control circuit complicated and increasing the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A programmable ROM comprising:
a SRAM cell which stores ROM data; and
a control circuit which controls an operation of programming and reading the ROM data, the SRAM cell including,
a first field effect transistor of a first conductivity type as a load having a source connected to a first power source terminal;
a second field effect transistor of a second conductivity type having a source connected to a second power source terminal and a drain connected to a drain of the first field effect transistor;
a third field effect transistor of the second conductivity type having a gate connected to a word line and used for data transfer between a first bit line and the drains of the first and second field effect transistors;
a fourth field effect transistor of the first conductivity type as a load having a source connected to the first power source terminal;
a fifth field effect transistor of the second conductivity type having a source connected to the second power source terminal and a drain connected to a drain of the fourth field effect transistor; and
a sixth field effect transistor of the second conductivity type having a gate connected to the word line and used for data transfer between a second bit line and the drains of the fourth and fifth field effect transistors,
wherein the gates of the first and second field effect transistors are connected to the drains of the fourth and fifth field effect transistors, the gates of the fourth and fifth field effect transistors are connected to the drains of the first and second field effect transistors, and
the control circuit writes reverse data which is reverse to the ROM data into the SRAM cell, turns off the third and sixth field effect transistors after writing the reverse data, and applies stress to the first and fourth field effect transistors, when the control circuit programs the ROM data to the SRAM cell.

2. The programmable ROM according to claim 1, wherein first power source voltage applied to the first power source terminal is higher than second power source voltage applied to the second power source terminal.

3. The programmable ROM according to claim 1, wherein a programming operation of the ROM data is performed by turning off the third and sixth field effect transistors in a state in which potentials of the drains of the first and second field effect transistors are set higher than potentials of the drains of the fourth and fifth field effect transistors and the threshold voltage of the first field effect transistor is set higher than the threshold voltage of the fourth field effect transistor.

4. The programmable ROM according to claim 1, wherein a read operation of the ROM data is performed by turning on the third and sixth field effect transistors in a state in which the threshold voltage of the first field effect transistor is set higher than the threshold voltage of the fourth field effect transistor and potential of the first bit line is set higher than potential of the second bit line.

5. The programmable ROM according to claim 1, further comprising:
a switch circuit connected between the first power source terminal and the sources of the first and fourth field effect transistors, and a latch circuit which latches the ROM data,
wherein the switch circuit is turned OFF immediately after the ROM data is latched in the latch circuit.

6. The programmable ROM according to claim 1, wherein the ROM data is programmed at a temperature higher than room temperature.

7. The programmable ROM according to claim 1, wherein the ROM data is programmed by setting a semiconductor area of the second conductivity type in which the first and fourth field effect transistors are formed to the same voltage as voltage applied to the first power source terminal.

8. A semiconductor integrated circuit comprising:
a memory cell array including SRAM cells;
a control circuit which controls an operation of programming and reading ROM data with respect to the SRAM cells;
an internal circuit controlled according to ROM data programmed in the SRAM cells; and
a third power source terminal connected to the internal circuit;
wherein each of the SRAM cells includes the first to sixth field effect transistors according to claim 1, the first power source terminal is connected to the SRAM cells and is not connected to the internal circuit.

9. The semiconductor integrated circuit according to claim 8, wherein a difference between first power source voltage applied to the first power source terminal and second power source voltage applied to the second power source terminal is larger than a difference between third power source voltage applied to the third power source terminal and the second power source voltage applied to the second power source terminal.

10. The semiconductor integrated circuit according to claim 8, wherein the control circuit turns off the third and sixth field effect transistors in the SRAM cells after sequentially writing data items which are reverse to program data items into all of the SRAM cells and simultaneously applies stress to all of the SRAM cells in a state in which the first power source voltage is applied to the first power source terminal in relation to a programming operation of the ROM data.

11. The semiconductor integrated circuit according to claim 8, wherein the control circuit applies the first power source voltage to the first power source terminal in a state in which the third and sixth field effect transistors in the SRAM cells are kept in an off state and then turns on the third and sixth field effect transistors in the SRAM cells in relation to a read operation of the ROM data.

12. The semiconductor integrated circuit according to claim 8, further comprising a switch circuit which is connected between the first power source terminal and the memory cell array and determines a period in which the first power source terminal is short-circuited to the SRAM cells, and a latch circuit which latches the ROM data,
wherein the first power source terminal is disconnected from the SRAM cells immediately after the ROM data is latched in the latch circuit.

13. The semiconductor integrated circuit according to claim 8, wherein the ROM data is programmed at a temperature higher than room temperature.

14. The semiconductor integrated circuit according to claim 8, wherein the ROM data is programmed by setting a semiconductor area of the second conductivity type in which the first and fourth field effect transistors are formed to the same voltage as voltage applied to the first power source terminal.

15. A programmable logic array comprising:
a memory cell array including a plurality of SRAM cells; and
a control circuit which controls an operation of programming and reading ROM data with respect to the SRAM cells,
wherein each of the SRAM cells includes the first to sixth field effect transistors according to claim 1, an input signal is input to the word line according to claim 1 and an output signal is output to the second bit line according to claim 1.

16. The programmable logic array according to claim 15, wherein
the ROM data is programmed by use of the word line, the first bit line and the second bit line according to claim 1 and the ROM data is read by use of the word line and the first bit line.

17. A programmable logic array comprising:
a memory cell array including a plurality of SRAM cells; and
a control circuit which controls an operation of programming and reading ROM data with respect to the SRAM cells,
wherein each of the SRAM cells includes the first to sixth field effect transistors according to claim 1, each of the SRAM cells according to claim 1 further including,
a seventh field effect transistor of the second conductivity type having a gate connected to a gate of the fifth field effect transistor and a source connected to the second power source terminal, and
an eighth field effect transistor of the second conductivity type having a gate connected to an input line, a source connected to a drain of the seventh field effect transistor, and a drain connected to an output line, wherein an input signal is input to the input line and an output signal is output to the output line.

18. The programmable logic array according to claim 17, wherein the ROM data is programmed by use of the word line, the first bit line and the second bit line and the ROM data is read by use of the input line and the output line.

19. A programmable logic array comprising:
a memory cell array including a plurality of SRAM cells; and
a control circuit which controls an operation of programming and reading ROM data with respect to the SRAM cells;
wherein each of the SRAM cells includes the first to sixth field effect transistors according to claim 1, each of the SRAM cells according to claim 1 further including,
a seventh field effect transistor of the second conductivity type having a gate connected to a gate of the fifth field effect transistor and a source connected to the second power source terminal, and an eighth field effect transistor of the second conductivity type having a gate connected to an input line, a source connected to a drain of the seventh field effect transistor, and a drain connected to the second bit line according to claim 1, wherein an input signal is input to the input line and an output signal is output to the second bit line according to claim 1.

20. The programmable logic array according to claim 19, wherein the ROM data is programmed by use of the word line, the first bit line and the second bit line and the ROM data is read by use of the input line and the second bit line.

* * * * *